(12) United States Patent
Sindhu et al.

(10) Patent No.: US 8,321,753 B2
(45) Date of Patent: Nov. 27, 2012

(54) OPTIMIZATION OF PACKET BUFFER MEMORY UTILIZATION

(75) Inventors: Pradeep Sindhu, Los Altos Hills, CA (US); Srihari Vegesna, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 316 days.

(21) Appl. No.: 12/759,313

(22) Filed: Apr. 13, 2010

(65) Prior Publication Data

US 2011/0252284 A1     Oct. 13, 2011

(51) Int. Cl.
*H03M 13/00* (2006.01)

(52) U.S. Cl. ......... 714/758; 714/722; 714/25; 714/47.1; 714/48; 714/52; 714/736; 714/799; 714/807

(58) Field of Classification Search ................... 714/722
See application file for complete search history.

(56) References Cited

U.S. PATENT DOCUMENTS

| | | | | |
|---|---|---|---|---|
| 6,381,706 B1* | 4/2002 | Zaczek | ........................ | 714/5.1 |
| 7,620,070 B1* | 11/2009 | Maufer et al. | ................ | 370/474 |
| 2002/0161972 A1* | 10/2002 | Talagala et al. | ............... | 711/114 |
| 2004/0158793 A1* | 8/2004 | Blightman et al. | ........... | 714/758 |
| 2006/0203367 A1* | 9/2006 | McAuliffe et al. | ............. | 360/39 |
| 2010/0218037 A1* | 8/2010 | Swartz et al. | ..................... | 714/6 |

OTHER PUBLICATIONS

Bagchi, S.; Liu, Y.; Whisnant, K.; Kalbarczyk, Z.; Iyer, R.; Levendel, Y.; Votta, L.; , "A framework for database audit and control flow checking for a wireless telephone network controller," Dependable Systems and Networks, 2001. DSN 2001. International Conference on , vol., No., pp. 225-234, Jul. 1-4, 2001.*
Wikipedia, "Error Detection and Correction", http://en.wikipedia.org/wiki/error_detection_and_correction, Jan. 9, 2010, 8 pages.
S. Deering et al., "Internet Protocol, Version 6 (IPv6) Specification", RFC 2460, Dec. 1998, 40 pages.
Juniper Networks, Inc., "Data Flow Through the M320 Router and T640 Routing Node Packet Forwarding Engine", 1998-2009, 2 pages.
Wikipedia, "Dynamic Random Access Memory", http://en.wikipedia.org/wiki/dynamic_random_access_memory, Jan. 12, 2010, 13 pages.
Eugene Chang et al., "CommsDesign—RLDRAMs vs. CAMs/SRAMs: Part 1", EE Times Community, Jun. 3, 2003, 7 pages.

* cited by examiner

*Primary Examiner* — John Trimmings
(74) *Attorney, Agent, or Firm* — Harrity & Harrity, LLP

(57) ABSTRACT

A method performed by an I/O unit connected to another I/O unit in a network device. The method includes receiving a packet; segmenting the packet into a group of data blocks; storing the group of data blocks in a data memory; generating data protection information for a data block of the group of data blocks; creating a control block for the data block; storing, in a control memory, a group of data items for the control block, the group of data items including information associated with a location, of the data block, within the data memory and the data protection information for the data block; performing a data integrity check on the data block, using the data protection information, to determine whether the data block contains a data error; and outputting the data block when the data integrity check indicates that the data block does not contain a data error.

23 Claims, 8 Drawing Sheets

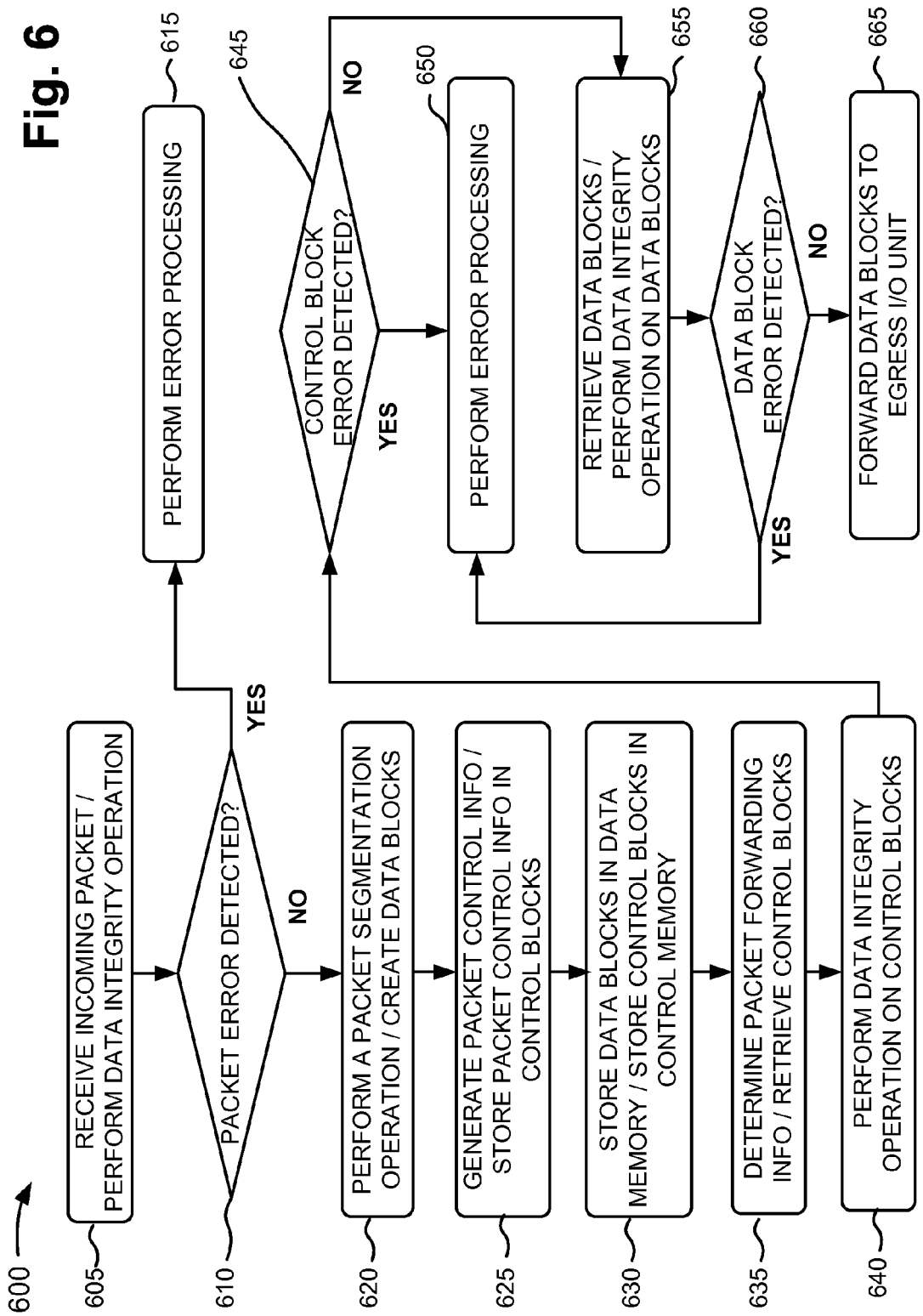

| CONTROL BLOCK ID 705 | DATA BLOCK ID 710 | DATA MEMORY ADDRESS 715 | OFFSET (BYTES) 720 | COUNT (BYTES) 725 | EOP (BIT) 730 | NEXT CONTROL MEMORY ADDRESS 735 | CHECKSUM (7 BITS) 740 | ECC (6 BITS) 745 |
|---|---|---|---|---|---|---|---|---|
| CB-1 | DB-1 | DM-10021 | 000 | 127 | 0 | CM-0002 | 34567891 | 876543 |
| CB-2 | DB-2 | DM-10054 | 000 | 127 | 0 | CM-0004 | 21987654 | 332198 |
| CB-3 | DB-3 | DM-10055 | 096 | 31 | 1 | -- | 3219876 | 876543 |

OPTIMIZATION OF PACKET BUFFER MEMORY UTILIZATION

BACKGROUND

Greater demands are being placed on communication and computing networks that carry an increasing volume of traffic, such as data, voice and video traffic. As the volume of traffic increases on a network, the need for high speed and high throughput network devices also increases. When transmitting packets through a network, it is desirable that nodes in the network be able to process packets to avoid traffic bottlenecks that can lead to widespread network congestion. When bottlenecks or congestion occur, it is often due to packet buffer memories being filled to capacity, which can cause packets to be dropped.

SUMMARY

According to one aspect, a method may be performed by an I/O unit connected to another I/O unit in a network device. The method may include receiving a packet at the I/O unit; segmenting the packet into a group of data blocks; storing the data blocks in a data memory; generating data protection information for each of the data blocks; creating a group of control blocks for the data blocks, each of the control blocks corresponding to a respective one of the data blocks, a particular control block, of the group of control blocks, corresponding to a particular data block, of the group of data blocks; storing, in a control memory, a group of data items for each of the control blocks, the data items, for the particular control block, including information associated with a location, of the particular data block, within the data memory, information associated with a location, of another one of the control blocks, within the control memory, and the data protection information for the particular data block; performing a data integrity check on the particular data block, using the data protection information from the particular control block, to determine whether the particular data block contains a data error; and outputting the particular data block when the data integrity check indicates that the particular data block does not contain a data error.

According to another aspect, a network device may be connected to a group of network devices. The network device may include a data memory to store a group of data blocks; a control memory to store a group of control blocks; and one or more I/O units. The one or more I/O units may receive a packet from another network device of the group of network devices; perform a segmentation operation on the packet to create the group of data blocks; store the group of data blocks in the data memory; create a group of control blocks for the group of data blocks, each of the group of control blocks corresponding to a respective one of the group of data blocks, a particular control block, of the group of control blocks, corresponding to a particular data block of the group of data blocks; store, in the control memory, the group of control blocks, each of the group of control blocks including a group of data items, the group of data items, for the particular control block, including data protection information for the particular data block, and information identifying a location of the particular data block in the data memory; perform a data integrity check on the particular data block, using the data protection information from the particular control block, to determine whether the particular data block contains a data error; and output the particular data block when the data integrity check indicates that the particular data block does not contain a data error.

According to yet another aspect, a system may include a network device connected to another network device via a network link. The network device may receive a packet; segment the packet into a group of data blocks; store the group of data blocks in a data memory; create a group of control blocks for the group of data blocks, each control block, of the group of control blocks, may correspond to a respective data block of the group of data blocks, a particular control block, of the group of control blocks, may correspond to one or more data blocks, of the group of data blocks; store, in the control memory, the group of control blocks, each of the group of control blocks may include control information, the control information for the particular control block may include data protection information for the one or more data blocks, and information associated with a location of the one or more data blocks, in the data memory; generate control protection information for the group of control blocks using the control information associated with the group of control blocks; perform a data integrity check on the particular control block, using the control protection information, associated with the particular control block, to determine whether the particular control block contains a data error; retrieve the one or more data blocks, from the data memory, using the control information in the control memory, when it is determined that the particular control block does not contain a data error; perform a data integrity check on the one or more data blocks, using the data protection information from the particular control block, to determine whether the one or more data blocks contains a data error; and output the one or more data blocks to the other network device via the network link when it is determined that the one or more data blocks does not contain a data error.

BRIEF DESCRIPTION OF THE DRAWINGS

FIG. 6 is a flowchart of an exemplary process for performing an incoming packet buffering operation that is capable of being performed by the node of FIG. 2;

FIG. 7 is a diagram of exemplary packet control information capable of being used by the node of FIG. 2.

DETAILED DESCRIPTION

Figure 1:
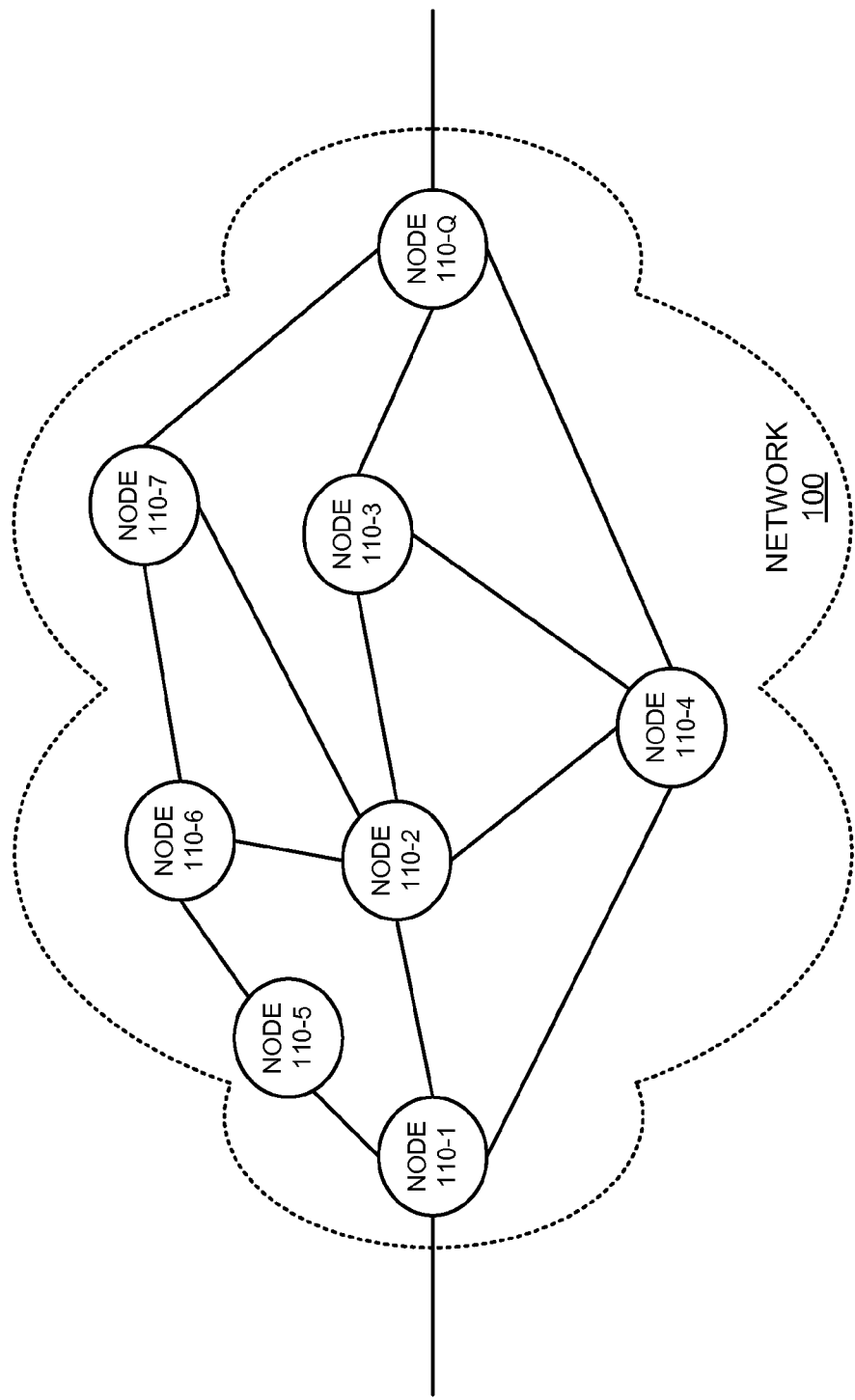
FIG. 1 is a block diagram of an exemplary network in which systems and/or methods, described herein, may be implemented.

The following detailed description refers to the accompanying drawings. The same reference numbers in different drawings may identify the same or similar elements. Also, the following detailed description does not limit the invention.

An implementation described herein may include systems and/or methods that provide for optimization of packet buffer memory utilization using a technique that can store data integrity information in a packet control memory instead of a packet buffer memory (hereinafter referred to as "data memory") within a node in a network. Storing data integrity information in packet control memory (hereinafter referred to as "control memory") may free up available data memory, which may increase the packet buffering capacity of a node, without incurring the cost and/or provisioning the space (e.g., the space on the memory board) associated with incorporating higher capacity memory devices and/or additional memory devices.

As described herein, by reconfiguring the packet control information framework (e.g., the packet control block configuration that stores packet control information and/or the control memory configuration that stores control blocks), data integrity information, that protects packet data (e.g., checksum information, error-correcting code (ECC) information, etc.), may be incorporated into packet control information. More particularly, packet control information may be reconfigured to include data integrity information that protects packet data (hereinafter referred to as "data protection information") that may be stored in packet control blocks and written to control memory instead of being stored in data memory. Thus, storing data protection information in control memory may increase packet buffering capacity by freeing up data memory used to buffer incoming and/or outgoing packets.

Also, as described herein, particular fields within packet control blocks may be reconfigured so that data protection information may be included. As one example, reserved bits within packet control blocks (hereinafter referred to as "control blocks") may be used to store data protection information associated with packet data (e.g., checksum, ECC, etc.). As another example, a portion of the bits, within the control block, used for error detection and correction corresponding to packet control information (hereinafter referred to as "control protection information"), may be used to store data protection information. Reconfiguring control blocks to include data protection information, by using reserved bits and/or by using a portion of the control protection information bits, may avoid the need to expand control memory, the expense associated with more memory devices, and/or the expense associated with higher capacity memory devices.

The term "packet," as used herein, may refer to a packet, a datagram, or a cell; a fragment of a packet, a fragment of a datagram, a fragment of a cell; or another type, arrangement, or packaging of data.

Exemplary Network

FIG. 1 is a block diagram of an exemplary network 100 in which systems and/or methods, described herein, may be implemented. As shown in FIG. 1, network 100 may include nodes 110-1, 110-2, ..., 110-Q (where Q≧1) (referred to collectively as "nodes 110," and individually as "node 110"). Nodes 110 may connect via a number of network links. The network links may include wired and/or wireless links. Each node 110 may connect to one or more other nodes 110. While FIG. 1 shows a particular number and arrangement of nodes 110, network 100 may include additional, fewer, different, or differently arranged nodes 110 than are illustrated in FIG. 1.

Node 110 may include a network device that transmits data traffic. For example, node 110 may take the form of a routing device, a switching device, a multiplexing device, or a device that performs a combination of routing, switching, and/or multiplexing functions. In one implementation, node 110 may be a digital device. In another implementation, node 110 may be an optical device. In yet another implementation, node 110 may be a combination of a digital device and an optical device.

Node 110 may include a component to receive, transmit, and/or process traffic on a network link or network link. For example, node 110 may include an Ethernet interface, an optical carrier (OC) interface, an asynchronous transfer mode (ATM) interface, or another type of interface. Node 110 may manage a set of one or more input ports via which packets can be received, a set of one or more output ports via which packets can be transmitted, and/or a set of one or more input/output ports via which packets can be received and transmitted.

Node 110 may perform certain operations on incoming and/or outgoing packets, such as decapsulation, encapsulation, demultiplexing, multiplexing, queuing, etc. operations, that may facilitate the processing and/or transportation of incoming and/or outgoing packets. In one implementation, node 110 may function as a node on a network link in network 100 (e.g., an ingress node, an intermediate node and/or an output node) and may receive packets, may perform operations on packets (e.g., append, remove, rerouting, and/or other operations) and may transmit packets to other nodes 110.

Node 110 may perform other operations on incoming and/or outgoing packets. For example, node 110 may perform data integrity operations on incoming and/or outgoing packets. In another example, node 110 may perform incoming packet buffering operations that may include performing packet segmentation operations (e.g., breaking the packet payload into segments), generating packet control information to manage packet data during packet buffering operations, and/or storing packet data and packet control information, etc. In yet another example, node 110 may perform outgoing packet buffering operations that may include retrieving packet control information and/or performing data integrity operations. Additionally, or alternatively, node 110 may, from the packet control information, retrieve packet segments, reassemble the packet segments into outgoing packets, and transmit outgoing packets in accordance with packet forwarding information.

Exemplary Node Configuration

Figure 2:
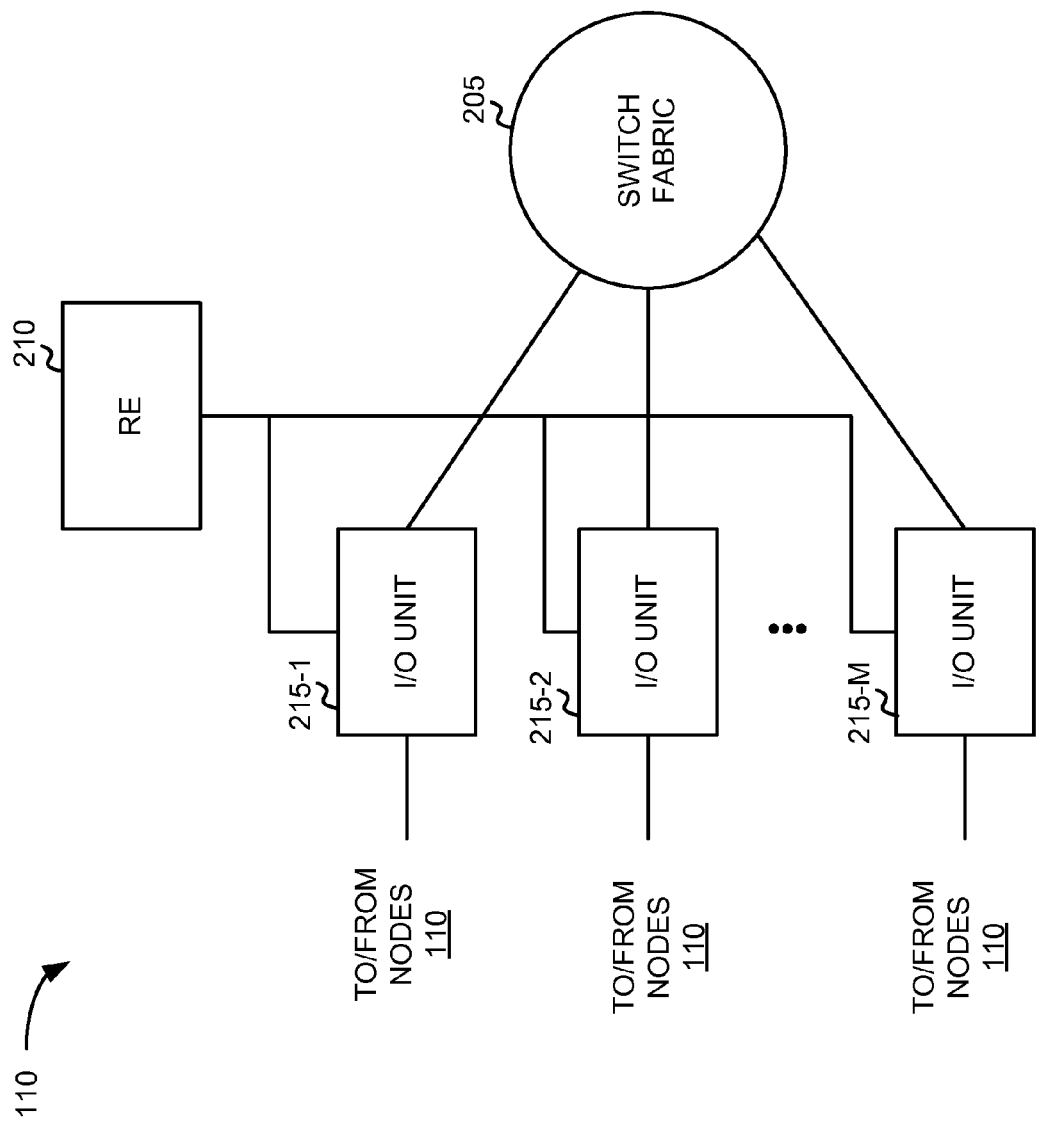
FIG. 2 is a diagram of exemplary components of a node of FIG. 1.

FIG. 2 is a diagram of exemplary components of node 110. As illustrated, node 110 may include a switch fabric 205, a routing engine 210 (hereinafter referred to as "RE 210"), and a group of input/output units 215-1, 215-2, ..., 215-M (where M≧1) (hereinafter referred to collectively as "I/O units 215" and individually as "I/O unit 215").

Switch fabric 205 may include one or more switching planes to facilitate communication among I/O units 215 and/or RE 210. In one implementation, each of the switching planes may include a single or multi-stage switch of crossbar elements. In another implementation, each of the switching planes may include some other form of switching elements. Switch fabric 205 may also, or alternatively, include processors, memories, and/or paths that permit communication among I/O units 215 and/or RE 210.

Switch fabric 205 may receive information from I/O unit 215 and may send the information to one or more other I/O units 215. For example, switch fabric 205 may receive control blocks and/or data blocks from an ingress I/O unit 215 via which an incoming packet was received and may forward the control blocks and/or data blocks to an egress I/O unit 215 via which an outgoing packet may be transmitted.

RE 210 may include a processor, a microprocessor, or some form of hardware logic (e.g., an application specific integrated circuit (ASIC) or a field programmable gate array (FPGA)). In one implementation, for example, RE 210 may include an Ethernet controller and/or another controller device. RE 210 may perform high-level management functions for node 110. For example, RE 210 may communicate with other networks and/or systems connected to node 110 to exchange information regarding network topology. RE 210 may create a routing table based on the network topology information, create forwarding table(s) based on the routing table, and may forward the forwarding table(s) to I/O units 215. RE 210 may also perform other general control and monitoring functions for node 110.

I/O unit 215 may include a component or collection of components to receive packets, to process incoming and/or outgoing packets, and/or to transmit outgoing packets. For example, I/O unit 215 may include I/O ports, a packet forwarding engine (PFE), an Ethernet interface and/or another type of interface, a central processing unit (CPU), and/or a memory device. I/O unit 215 may include a collection of ports that connect, via physical links, to nodes 110 in network 100. The PFE may include packet processing component(s), switch interface component(s), Internet processor component(s), memory device(s), etc.

I/O unit 215 may perform certain operations on incoming and/or outgoing packets, such as decapsulation, encapsulation, demultiplexing, multiplexing, queuing, dequeuing, etc. operations, that may facilitate the processing and/or transportation of incoming and/or outgoing packets. I/O unit 215 may receive incoming packets and may forward the incoming packets to other I/O units 215 via switch fabric 205. For example, I/O unit 215 may receive incoming packets and may determine to which other I/O units 215 the incoming packets may be sent based on a forwarding table (e.g., received from RE 210).

I/O unit 215 may perform incoming packet buffering operations. For example, I/O unit 215 may receive packets and may remove header information from the packet. I/O unit 215 may perform a segmentation operation on the packet data (e.g., the data payload portion of the packet) by breaking the packet data into fixed-length fragments (hereinafter referred to collectively as "data blocks" and individually as a "data block"). I/O unit 215 may generate control blocks to store packet control information associated with the data blocks. I/O unit 215 may store the data blocks in a data memory and may store the control blocks in a control memory.

I/O unit 215 may perform outgoing packet buffering operations. For example, I/O unit 215 may retrieve control blocks from control memory and may remove control protection information from the control blocks (e.g., checksum information, ECC information and/or other forms of control protection information). From the control protection information, I/O unit 215 may perform a data integrity operation to determine whether the packet control information, obtained from the control blocks, contains an error. I/O unit 215 may, from the packet control information, retrieve data blocks from data memory and may reassemble the data blocks into outgoing packets for transmission to the next node 110 and/or other network device.

Although FIG. 2 shows exemplary components of node 110, in other implementations, node 110 may contain fewer components, different components, differently arranged components, or additional components than depicted in FIG. 2. Alternatively, or additionally, one or more components of node 110 may perform one or more functions described as being performed by one or more other components of node 110.

Figure 3:
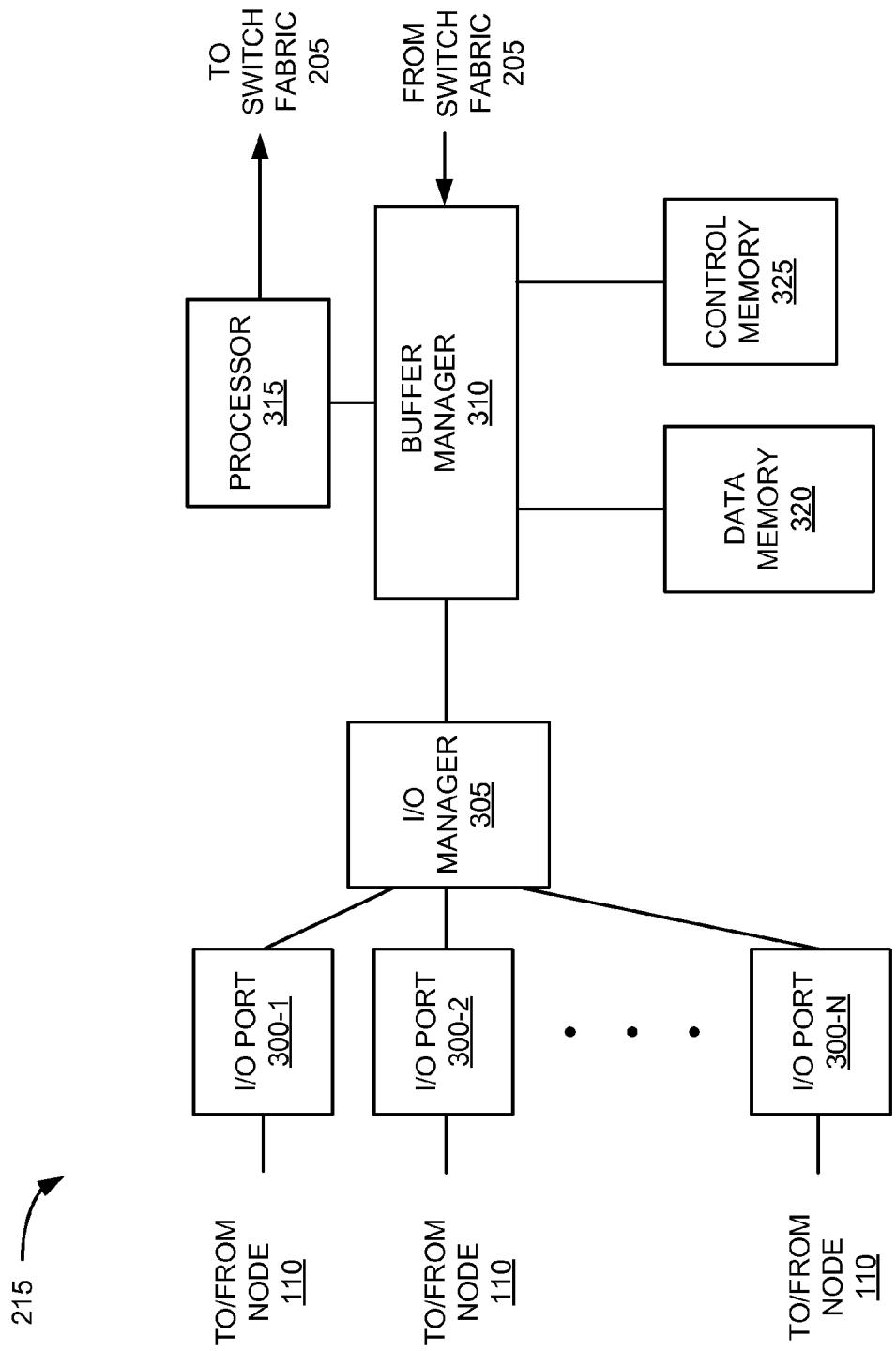
FIG. 3 is a diagram of exemplary components of an input/output unit of FIG. 2.

FIG. 3 is a diagram of exemplary components of I/O unit 215. As illustrated, I/O unit 215 may include a group of I/O ports 300-1, 300-2, . . . , 300-N (where $N \geq 1$) (hereinafter referred to collectively as "I/O ports 300" and individually as "I/O port 300"), an I/O manager 305, a buffer manager 310, a processor 315, a data memory 320 and a control memory 325.

I/O ports 300 may be a point of attachment for a physical link and/or may include a component to receive, transmit, and/or process packets on a network link or network link. For example, I/O ports 300 may include an Ethernet interface, an OC interface, an ATM interface, or another type of interface. I/O ports 300 may include a variety of physical interfaces via which packets can be received, can be transmitted, or can be received and transmitted. In another implementation, I/O ports 300 may collectively comprise a physical interface card (PIC). I/O ports 300 may be connected to I/O manager 305 and may send incoming packets to I/O manager 305 and/or may receive outgoing packets from I/O manager 305.

I/O manager 305 may include a processor, a microprocessor, or some form of hardware logic (e.g., an ASIC or a FPGA) and/or a component or collection of components to receive packets, process incoming and/or outgoing packets, and/or transmit outgoing packets. For example, I/O manager 305 may include a PFE, an Ethernet interface and/or another type of interface, a CPU, and/or a memory device. The PFE may include packet processing component(s), switch interface component(s), Internet processor component(s), memory device(s), etc. I/O manager 305 may be interconnected with I/O ports 300, buffer manager 310 and/or other components within I/O unit 215.

I/O manager 305 may perform certain operations on incoming and/or outgoing packets, such as decapsulation, encapsulation, demultiplexing, multiplexing, queuing, dequeuing, etc. operations, that may facilitate the processing and/or transportation of incoming and/or outgoing packets.

I/O manager 305 may receive incoming packets and may process the incoming packets. For example, I/O manager 305 may receive incoming packets from network 100, via I/O ports 300, and may remove the header from the incoming packets. I/O manager 305 may obtain header information from the header and may remove or generate data protection information (e.g., checksum, ECC, etc.) from the header information. Using the data protection information, I/O manager 305 may perform data integrity operations on incoming packets. I/O manager 305 may perform segmentation operations on incoming packets. For example, I/O manager may divide the packet data into fixed-length data blocks (e.g., 32 bytes, 64 bytes, 128 bytes, etc.) and may forward the data blocks, with the header, to buffer manager 310.

I/O manager 305 may retrieve data blocks and/or control blocks in response to packet forwarding notifications. For example, I/O manager 305 may receive packet forwarding notifications from processor 315, via buffer manager 310, and may generate headers associated with outgoing packets. I/O manager 305 may receive, from processor 315 and via buffer manager 310, control block pointer information and from the control block pointer information, I/O manager 305 may send a request to buffer manager 310 to retrieve the control blocks. I/O manager 305 may receive the control blocks and may perform data integrity operations on control blocks to determine whether the control blocks contain an error.

In another example, from the packet control information obtained from the control blocks, I/O manager 305 may send read requests to buffer manager 310, to retrieve the data blocks associated with the control blocks. I/O manager 305 may receive data blocks and may perform data integrity operations on the data blocks to determine whether the data blocks contain an error. I/O manager 305 may reassemble the packets, from the data blocks and may append the headers to the packets to create outgoing packets. I/O manager 305 may transmit outgoing packets, via I/O ports 300, to the next node 110 according to packet forwarding information.

Buffer manager 310 may include a processor, a microprocessor, or some form of hardware logic (e.g., an ASIC or a FPGA) and/or a component or collection of components to process incoming and/or outgoing data blocks, generate control blocks, and/or handle data write requests and/or data read requests. For example, buffer manager 310 may include a CPU, a memory device, packet processing component(s), switch interface component(s), etc. Buffer manager 310 may be interconnected with I/O manager 305, processor 315, data memory 320, control memory 325, and/or switch fabric 205.

Buffer manager 310 may perform data storage operations, data integrity operations and/or data retrieval operations. For example, buffer manager 310 may receive data blocks and/or header information from I/O manager 305 associated with incoming packets. Buffer manager 310 may generate data protection information (e.g., checksum, ECC and/or other data protection information) for the data blocks. Buffer manager 310 may communicate with data memory 320 to store and/or obtain data memory information associated with data blocks (e.g., storage location, offset, count, etc.) and/or may store data blocks in data memory 320. Buffer manager 310 may generate a control block corresponding to each data block and may communicate with control memory 325 to obtain control memory information (e.g., control block pointer information and/or end of packet information). Buffer manager 310 may generate packet control information from the data protection information, data memory information and/or control memory information and may generate control protection information (e.g., checksum, ECC and/or control protection information) from the packet control information. Buffer manager 310 may store the packet control information and the control protection information in the control blocks. Buffer manager 310 may store the control blocks in control memory 325 and/or may send a control block pointer and/or the header information to processor 315.

Buffer manager 310 may process a read request received from processor 315. For example, buffer manager 310 may receive a read request from processor 315 to retrieve control blocks from control memory 325. The read request may include control block pointer information (e.g., an address within control memory 325 from which the first control block may be read). Buffer manager 310 may communicate with control memory 325 to retrieve the control blocks and may forward the control blocks to processor 315. In another example, buffer manager 310 may receive a read request from processor 315 to retrieve data blocks associated with the control blocks. Buffer manager 310 may retrieve the data blocks from data memory and may forward the data blocks to processor 315 and/or another I/O unit 215 (e.g., an egress I/O unit 215 from which an outgoing packet, assembled from the data blocks, may be sent) via switch fabric 205.

Additionally, or alternatively, buffer manager 310 may process a read request received from I/O manager 305. For example, buffer manager 310 may receive a read request from I/O manager 305 to retrieve control blocks and/or data blocks and, in a manner similar to that discussed above, may retrieve control blocks from control memory 325 and/or data blocks from data memory 320 and may forward the control blocks and/or data blocks to I/O manager 305.

Processor 315 may include a processor, a microprocessor, some form of hardware logic (e.g., an ASIC or a FPGA) and/or may include a component or collection of components to receive, send and/or process data blocks, control blocks, header information, route lookups and/or notifications. For example, processor 315 may include a CPU, a memory device, switch interface component(s), Internet processor component(s), etc. Processor 315 may be interconnected with buffer manager 310, switch fabric 205 and/or RE 210.

Processor 315 may perform packet forwarding operations. For example, processor 315 may receive header information and control block pointer information from buffer manager 310 and may retrieve a forwarding table (e.g., received from RE 210) from a memory (e.g., a memory associated with processor 315) to perform a lookup to identify the next hop information and/or the corresponding egress I/O unit 215 (e.g., I/O unit 215 from which data blocks, once reassembled into outgoing packets, may be transmitted). Processor 315 may forward, as a packet forwarding notification, the header and/or the next hop information to the egress I/O unit 215. In one example, the packet forwarding notification may be appended to data blocks and forwarded to egress I/O unit 215, via switch fabric 205. In another example, the packet forwarding notification may be forwarded to egress I/O unit 215 via a control plane that may be separate from switch fabric 205.

Processor 315 may receive control blocks and may process the control blocks. For example, processor 315 may use the control block pointer information to retrieve control blocks from control memory 325, via buffer manager 310. Processor 315 may perform data integrity operations on control information stored in each control block. Additionally, or alternatively, processor 315 may retrieve data blocks from data memory 320, via buffer manager 310, using data memory information obtained from the control blocks. Processor 315 may forward the data blocks to an egress I/O unit 215. In one implementation, processor 315 may perform data integrity operations on the data blocks and may forward the data blocks to an egress I/O unit 215 via switch fabric 205. In another implementation, for example, processor 315 may append packet control information (e.g., control protection information and/or data protection information) to the data blocks and may forward the data blocks to the egress I/O unit 215 via switch fabric 205. In another example, processor may forward packet control information to egress I/O unit 215 via a control plane that may be separate from switch fabric 205.

Data memory 320 may include a component or set of components that are capable of writing, storing, and/or reading information. Data memory 320 may include a memory device or group of memory devices, a processor, a microprocessor, or some form of hardware logic (e.g., an ASIC or a FPGA). For example, data memory 320 could be a reduced latency dynamic random access memory (RLDRAM) that may include a memory component (e.g., an integrated circuit configured to read, to write, and/or to store data blocks). In another example, data memory 320 could be a dynamic random access memory (DRAM) and/or some other form of random access memory (RAM) that may include a memory component configured to read, to write and/or to store data blocks of a particular fixed length (e.g., 32 bytes, 64 bytes, 128 bytes, etc.). Data memory 320 may be connected to buffer manager 310.

Data memory 320 may communicate with memory buffer 310 to write, to store, and/or to read data information received from data blocks. For example, data memory 320 may receive data blocks of the particular fixed length and may write the data blocks into the configured memory partitions. Data memory 320 may respond to read requests from buffer manager 310 and may retrieve and/or forward data blocks to buffer manager 310.

Control memory 325 may include a component or set of components that are capable of writing, storing and/or reading information. Control memory 325 may include a memory device or group of memory devices, a processor, a microprocessor, or some form of hardware logic (e.g., an ASIC or a FPGA). For example, control memory 325 could be a DRAM and/or some other form of RAM that may include a memory component or set of memory components that are configured to read, to write, and/or to store control blocks of a particular fixed length (e.g., 32 bits, 64 bits, 72 bits, etc.). Control memory 325 may be connected to buffer manager 310.

Control memory 325 may communicate with memory buffer 310 to read, to write, and/or to store packet control information. For example, control memory 325 may receive control blocks of the particular fixed length (e.g., 32 bits, 64 bits, 72 bits, etc.) from buffer manager 310 and may write the control blocks into the configured memory partitions. Control memory 325 may provide control block pointer information (e.g., control block address information corresponding to the first control block of a group of control blocks) to buffer manager 310. Control memory 325 may respond to read requests from buffer manager 310 and may retrieve and/or forward the control blocks to buffer manager 310.

Although FIG. 3 illustrates exemplary components of I/O unit 215, in other implementations, I/O unit 215 may contain fewer components, different components, differently arranged components, or additional components than depicted in FIG. 3. Alternatively, or additionally, one or more components of I/O unit 215 may perform one or more functions described as being performed by one or more other components of I/O unit 215.

Exemplary Data Configuration

Figure 4:
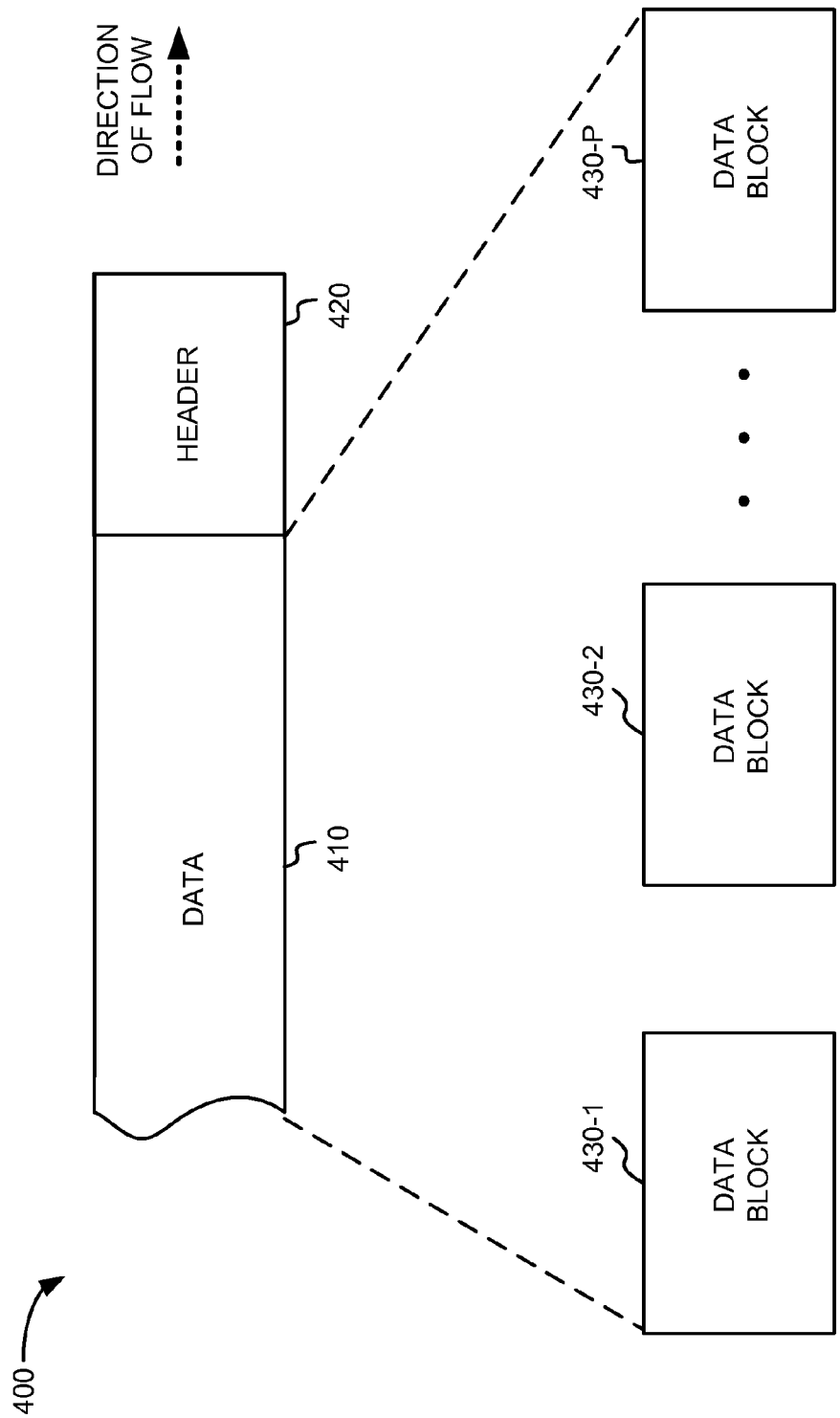
FIG. 4 is a diagram of an exemplary segmented packet.

FIG. 4 is a diagram of an exemplary segmented packet 400. As illustrated, packet 400 may include a data field 410 and a header field 420. In another implementation, packet 400 may include additional fields, fewer fields, different fields, and/or differently arranged fields than are shown in FIG. 4. Data field 410 may include information, such as data, audio, and/or video, transported over network 100. Header field 420 may include destination address information, source address information, packet protocol information, etc. Data field 410 may be segmented into data blocks 430-1, 430-2, . . . , 430-P (where P≧1) (hereinafter referred to collectively as "data blocks 430" and individually as "data block 430").

Data blocks 430 may have a fixed length (e.g., 32 bytes, 64 bytes, etc.) that may correspond to a particular memory partition length associated with data memory 320. For example, assume data field 410 has a length of 256 bytes and data memory 320 is configured with 64-byte memory partitions. Data field 410 may be segmented (e.g., by I/O manager 305) into four fixed-length data blocks of 64 bytes each and stored in memory partitions, each with a specific memory address, within data memory 320.

In another example, assume data field 410 has a length of 288 bytes. Data field 410 may be segmented into five data blocks 430 in which data blocks 430-1 through 430-4 each have a fixed length of 64 bytes of packet data. Data block 430-5 may have a fixed length of 64 bytes in which only 32 bytes include packet data and the remaining 32 bytes may be set to a particular value (e.g., zero or one). In this case, data blocks 430-1 through 430-4 may be assigned (e.g., by I/O unit 215) an offset of zero bytes and a count of 64 bytes. An offset of zero may indicate that a particular data block 430, stored at a particular address in data memory 320, may contain packet data in the first byte of the particular data block 430. A count of 64 bytes may indicate that there are 64 bytes of packet data contained in the particular data block 430. Thus, in the example above, the fifth data block 430 (e.g., data block 430-5) may have an offset of 32 and a count of 32, which may indicated that packet data is contained at the 33$^{rd}$ byte of data block 430-5 and continues, for a count of 32 bytes, until the 64$^{th}$ byte. In yet another example, data block 430-5 may have an offset of 14 bytes and a count of 32 bytes, which may indicate that packet data begins at the 15$^{th}$ byte and continues, for a count of 32 bytes, to the 47$^{th}$ byte of data block 430. Offset information and/or count information may be incorporated into the packet control information (e.g., by I/O unit 215) and stored in control blocks corresponding to each data block 430.

While data blocks and memory partitions with a length of 64 bytes are discussed above for illustration purposes, it should be understood that, in other implementations, data blocks and/or memory partitions different from 64 bytes may be used.

Figure 5A:
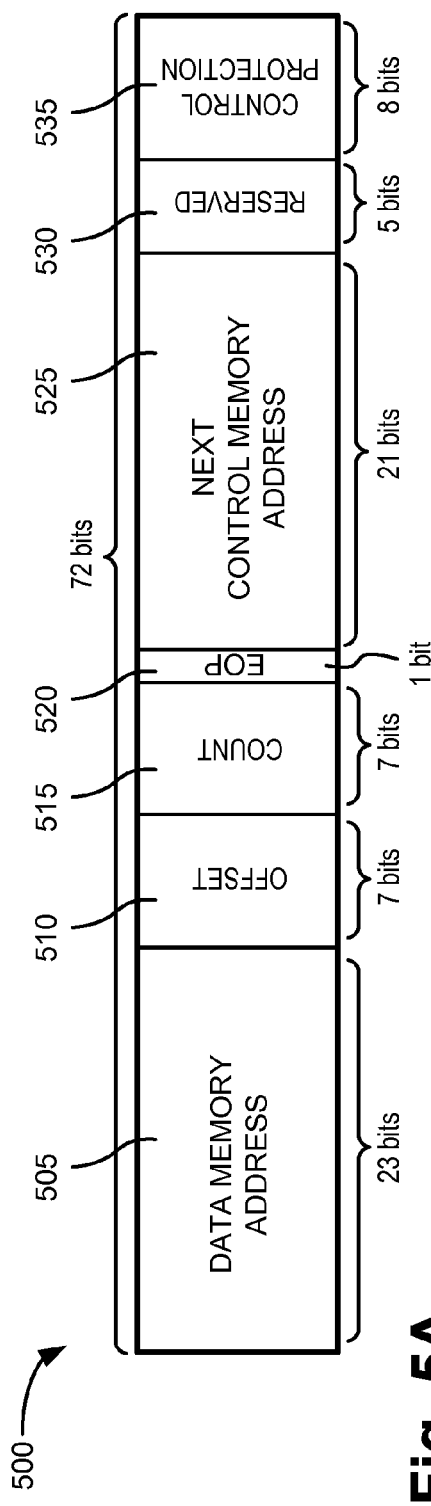
FIGS. 5A and 5B are diagrams of exemplary control block configurations.
Figure 5B:
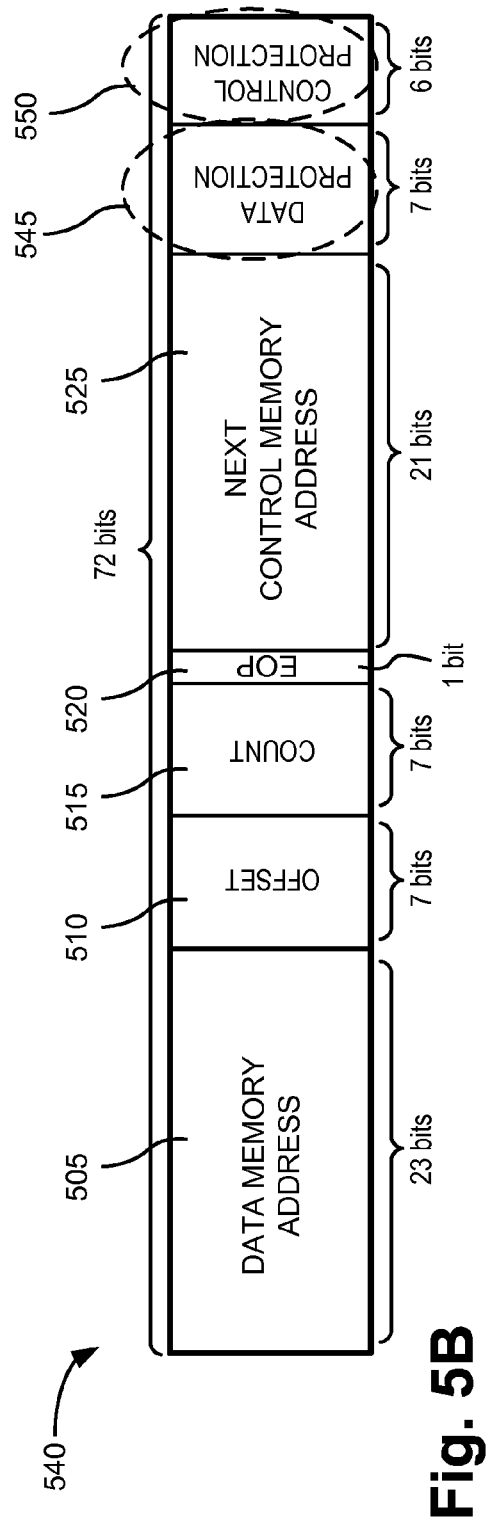

FIGS. 5A and 5B are diagrams of exemplary control block configurations 500 and 540, respectively. As illustrated in FIG. 5A, control block 500 may include data memory address field 505, offset field 510, count field 515, end-of-packet (EOP) field 520, next control memory address field 525, reserved field 530, and control protection field 535.

Control block 500 may have a fixed length (e.g., 72 bits) and may include packet control information that may be used by I/O unit 215 to process and/or perform operations on data blocks obtained from incoming packets and/or to be reassembled to create outgoing packets. Data memory address field 505 may be a 23-bit field that may store address information associated with a particular data block stored in data memory 320. Offset field 510 may be a 7-bit field that may, as described above in FIG. 4, specify the location of the first byte of packet data stored within a fixed-length data block (e.g., data block 430 of FIG. 4). Count field 515 may be a 7-bit field that may, as described above in FIG. 4, specify the number of bytes of packet data that may be stored within a data block.

EOP field 520 may be a 1-bit field and may be set to one if a particular control block corresponds to the last data block, of a group of data blocks, stored in data memory 320. For example, packet data may be divided into a group of three data blocks containing a first part, a second part and a third part of the packet data. Buffer manager 310 may generate a group of control blocks corresponding to the group of data blocks. In this example, the control blocks corresponding to the data blocks, containing the first part and the second part of the packet data, may include EOP fields 520 that are each set to zero, which may indicate that additional control blocks and/or data blocks are included in the group. The other control block, corresponding to the data block that contains the third part of the packet data, may include an EOP field 520 that is set to one, which may indicate that the corresponding data block includes the end of the packet data.

Next control memory address field 525 may be a 21-bit field and may include the address of the next control block stored in control memory 325. Next control memory address may sometimes be referred to as a control block pointer. Reserved field 530 may be a 5-bit field and may not have a designated use for node 110. Reserved field 530 may be set to a particular value (e.g., zero, one, and/or some other value), may be discarded and/or may be ignored by I/O unit 215. Control protection field 535 may be an 8-bit field and may include control protection information, such as checksum information, ECC information or some other form of data integrity information used for error detection and/or error correction. The control protection information may be used, by I/O unit 215, to perform data integrity operations on all or a portion of the 64 bits of control information stored in fields 505 through 530 of control block 500.

Control block 500, however, may not contain data protection information, which may indicate that data protection information may be stored in data memory 320 or elsewhere. Storing data protection information in data memory 320 may reduce the quantity of data blocks, and thus buffering capacity of I/O unit 215, that can be stored in memory 320. Additionally, or alternatively, storing data protection information in a separate and/or external memory (e.g. an RLDRAM) may include incurring a cost and/or provisioning the space (e.g., the space on the memory board) associated with incorporating other memory devices (e.g., an RLDRAM) on memory boards within I/O unit 215.

Control block 540, of FIG. 5B, may have a fixed length (e.g., 72 bits) and may include packet control information that may be used by I/O unit 215 to process and/or perform operations on data blocks obtained from incoming packets and/or to be reassembled to create outgoing packets. Control block 540 may include fields 505 through 525 as discussed above with respect to control block 500 of FIG. 5A. Control block 540, however, may be configured, as illustrated in FIG. 5B, to include data protection field 545 and a resized control protection field 550 (e.g., as compared with field 535 of FIG. 5A). Storing data protection information in data field 545 may enable data protection information to be stored in control memory 325, instead of data memory 320, which may increase the quantity of data blocks that can be stored in data memory 320 and/or may increase the packet buffering capacity of I/O unit 215.

Data protection information field 545 may be a 7-bit field and may include data protection information associated with a particular fixed-length data block, a group of data blocks, or an entire packet. The 7 bits used to create data protection field 545, in control block 540, may be obtained by reassigning the five bits from reserved field 530 of FIG. 5A to data protection field 545 and by assigning two bits from 8-bit control protection field 535 of FIG. 5A to data protection field 545. The reassignment of the two bits from 8-bit control protection field 535 of FIG. 5A may create 6-bit control protection field 550, in control block 540, as illustrated in FIG. 5B. Reconfiguring packet control information and storing the reconfigured control information in block 540, in a manner similar to that discussed above, may avoid expanding control block 540 (e.g., to a length that is greater than 72 bits), and may avoid the cost associated with incorporating an additional memory device to store data protection information. Additionally, or alternatively, storing data protection information in control memory 325, instead of a separate device, may avoid the additional processing steps and/or time to perform read/write operations associated with data protection information stored in the separate memory.

In one implementation, assume a particular data block has a fixed length of 128 bytes and is stored in data memory 320. Data protection information stored in field 545 may be a 7-bit checksum string computed, by I/O unit 215, from the 128 bytes of data, corresponding to the particular data block, corresponding to a group of data blocks, or corresponding to the entire packet, using a checksum algorithm. The computed checksum may be used to detect accidental bit errors in a data block, a group of data blocks, the entire packet, or control blocks that may have occurred during transmission, processing, and/or storage. The checksum may be computed from a hashing algorithm (e.g., non-cryptographic or cryptographic) that may permit bit errors to be detected if a checksum, computed at a later point in time (e.g., when the data block, the group of data blocks, or the packet is received and/or processed), yields a different result than the checksum computed when the data block, the group of data blocks, or the packet was generated and/or stored. For example, I/O unit 215 may retrieve a particular data block, a particular group of data blocks, or packet data for reassembly and may compute the checksum for the particular data block, the particular group of data blocks, or the packet data. I/O unit 215 may compare the computed checksum with another checksum stored in field 545 of control block 540 corresponding to the particular data block, the particular group of data blocks, or the particular packet data to determine whether an error is contained in the particular data block, the particular group of data blocks, or the packet data.

While checksum algorithms used for error detection are discussed above for illustration purposes, it should be understood that, in other implementations, other error detection and/or error correction algorithms may be used, such as Hamming codes, cyclic redundancy checks (CRC), non-cryptographic hashing functions, cryptographic hashing functions, and/or other forms of error detection functions different from checksum algorithms may be used.

Control protection field 550, may be a 6-bit field and may include control protection information associated with the 64 bits of packet control information stored in fields 505 through 545. Control protection field 550 may include data integrity information (e.g., error detection and/or error correction information) that may be used to protect all or a portion of the packet control information stored in control block 540. For example, the data integrity information may include an ECC string of six bits (sometimes referred to as parity bits) that may be computed by I/O unit 215 when particular control blocks are generated. The ECC string may be generated using an algorithm based on a single (e.g., 1-bit) error-correcting and/or double (e.g., 2-bit) error detecting (SECDED) Hamming code. The ECC string of six bits, generated by the Hamming code algorithm, may provide SECDED protection for up to approximately 57 bits of packet control information (e.g., based on the Hamming code in which the number of bits protected is equal to: $2^H-H-1$, where H represents the number of ECC bits and $H \geq 2$). The 6-bit ECC string, therefore, may be used, by I/O unit 215, to provide SECDED protection for the 21-bit next control memory address field 525, the 7-bit data protection field 545 and the majority of the remaining protection control information, stored in fields 505 through 520, of control block 540.

While Hamming code-based algorithms, used for error detection and/or error correction, are discussed above for illustration purposes, it should be understood that, in other implementations, other error detection and/or error correction algorithms, such as automatic repeat requests (ARQs), Reed-Solomon codes, checksum algorithms and/or other forms of error detection and/or error correction functions, different from Hamming code-based algorithms, may be used.

Although FIGS. 5A and 5B illustrate exemplary control block configurations 500 and 540, in other implementations, control blocks 500 and 540 may contain fewer fields, different fields, differently arranged fields, or additional fields than depicted in FIGS. 5A and 5B. Alternatively, or additionally, although control blocks 500 and 540 depict a length of 72 bits, in other implementations, control blocks 500 and 540 may have a length that includes a fewer number of bits, the same number of bits, or a greater number of bits. Alternatively, or additionally, although control blocks 500 and 540 include fields of a particular length, in other implementations, control blocks 500 and 540 may include fields with a fewer number of bits the same number of bits, or a greater number of bits.

Exemplary Processes

FIG. 6 is a flowchart of an exemplary process 600 for performing an incoming packet buffering operation that is capable of being performed by node 110. In one implementation, process 600 may be performed by an I/O unit 215. In another implementation, some or all of process 600 may be performed by a device or collection of devices separate from or in combination with I/O unit 215. FIG. 7 is a diagram of an exemplary packet control information table 700 capable of being used by node 110. A portion of process 600, of FIG. 6, will be discussed below with corresponding references to packet control information table 700 shown in FIG. 7.

Process 600, of FIG. 6, may include receiving an incoming packet and performing a data integrity operation (block 605). For example, I/O unit 215 may receive an incoming packet, from network 100, and may remove the header from the packet. From the header, I/O unit 215 may obtain data protection information, such as checksum information, ECC information and/or other forms of data protection information. In one example, I/O unit 215 may remove checksum information from the header and, based on the packet data, may compute checksum information using a checksum algorithm retrieved from a memory (e.g., a memory associated with I/O unit 215). I/O unit 215 may compare the computed checksum information with the checksum information obtained from the header to determine whether the incoming packet data contains an error.

In other examples, I/O unit 215 may obtain data protection information from headers, removed from incoming packets, that may include ECC information, parity bits and/or other forms of data protection information and may use other error detection and/or error correction algorithms (e.g., based on Hamming codes, cyclic redundancy checks (CRCs), etc.), non-cryptographic or cryptographic hashing functions, and/or other error detection and/or error correction codes) to perform data integrity operations.

If a packet error is detected (block 610—YES), then error processing may be performed (block 615). For example, I/O unit 215 may compare the computed checksum information with the checksum information removed from the header and may determine that the computed checksum information does not match the checksum information obtained from the header. I/O unit 215 may determine that the incoming packet contains an error and may send an error notification notifying another node 110 (e.g., node 110 from which the incoming packet was sent) that a particular packet, or set of packets, was received with an error. Additionally, or alternatively, in one example, I/O unit 215 may process the packet, with the errors, and may forward the packet with the errors to an egress I/O unit 215 via which the packet may be transmitted to the next node 110. In another example, I/O unit 215 may drop the packet. In yet another example, if data protection information, obtained from the header, includes ECC information, I/O unit 215 may correct the error in the packet using an ECC algorithm, such as that described above.

If a packet error is not detected (block 610—NO), then a packet segmentation operation may be performed and data blocks may be created (block 620). For example, I/O unit 215 my compare the computed checksum information with the checksum information removed from the header and may determine that the computed checksum information matches the checksum information obtained from the header. I/O unit 215 may determine that the incoming packet does not contain errors and may perform a packet data segmentation operation. In this example, assume that the incoming packet contains 288 bytes of data and that data memory (e.g., data memory 320) is configured to store data blocks with a fixed length of 128 bytes. I/O unit 215 may divide the packet data into fixed-length data blocks. For example, I/O unit 215 may divide the packet data into a first data block (e.g., DB-1) containing 128 bytes of packet data, a second data block (e.g., DB-2) containing 128 bytes of packet data and a third data block (e.g., DB-3) containing 32 bytes of packet data and 96 bytes that are not packet data. The 96 bytes that are not packet data (hereinafter referred to as "dummy bytes") may be set to a particular value (e.g., zero, one and/or some other value) and may be ignored, discarded, or used for another purpose by I/O unit 215.

As illustrated in FIG. 7, packet control information table 700 may include control block ID field 705, data block ID field 710, data memory address field 715, offset field 720, count field 725, EOP field 730, next control memory address field 735, checksum field 740 and ECC field 745. For example, control block ID field 705 may include a control block identifier that corresponds to a control block that stores packet control information corresponding to a particular data block, group of data blocks, or packet. Data block ID field 710 may include a data block identifier corresponding to a data block or a group of data blocks, created from an incoming packet, that may be stored in data memory (e.g., data memory 320). Data block identifiers associated with the group of three data blocks created from the incoming packet are shown in FIG. 7 as DB-1, DB-2 and DB-3 (as indicated by ellipse 750).

Fields 715 through fields 745 correspond to the fields within control block 540 of FIG. 5B. For example, data memory address 715 may include an address in data memory 320 at which a particular data block and/or a group of data blocks (e.g., identified in data block ID field 710) is stored. Offset field 720 may include the number of dummy bytes contained in a particular data block that precede bytes that contain packet data in a manner similar to that described above (e.g., with respect to field 510, associated with control blocks 500 and 540, of FIGS. 5A and 5B). Count field 725 may include the number of bytes containing packet data stored in a particular data block or group of data blocks in a manner similar to that described above (e.g., with respect to field 515, associated with control blocks 500 and 540, of FIGS. 5A and 5B). EOP field 730 may contain a bit that may be set to a particular value (e.g., zero) if additional data blocks and/or control blocks are included in a group of data blocks and/or control blocks and may be set to another value (e.g., one) if the particular data blocks and/or control block is the last data block and/or control block in the group of data blocks and/or control blocks. Next control memory address 735 may include an address, within control memory (e.g., control memory 325) corresponding to the next control block in a group of control blocks (sometimes referred to as "control block pointer"). Checksum field 740 may include data protection information, such as, in this example, checksum information that includes seven bits. ECC field 745 includes control protection information, such as, in this example, ECC information that includes six bits.

Packet control information may be generated and packet control information may be stored in control blocks (block 625). For example, I/O unit 215 may communicate with data memory 320 to obtain data memory information that may include storage location information, offset, count, and/or allocated memory for each data block or group of data blocks. As illustrated in FIG. 7, the first data block (e.g., DB-1) may be stored at a particular data memory 320 location (e.g., DM-10021), with an offset of zero bytes and with a count of 127 bytes; the second data block (e.g., DB-2) may be stored at another data memory 320 location (e.g., DM-10054), with an offset of zero bytes and with a count of 127 bytes; and the third data block (e.g., DB-3) may be stored at yet another data memory 320 location (e.g., DM-10055), with an offset of 96 bytes and with a count of 31 bytes (e.g., as indicated in ellipse 755).

Data protection information may be generated. For example, from each data block (e.g., DB-1, DB-2 and/or DB-3), I/O unit 215 may generate checksum information and/or other forms of data protection information (e.g., ECC information, etc.) using a checksum algorithm and/or another form of data protection algorithm. As shown by ellipse 760 of FIG. 7, I/O unit 215 may generate 7-bit checksum information for DB-1 through DB-3 (e.g., 34567891 for DB-1, etc.), which may be used by I/O unit 215 and/or another I/O unit 215 to perform data integrity operations on data blocks to detect whether errors are contained in the data blocks.

In one implementation, a running total of the checksum information may be generated. For example, I/O unit 215 may compute a sum of the checksum information generated for each data block and may store, in a control block associated with a particular data block, or a group of data blocks, the running total of the checksum information. The running total of the checksum information may be computed when the checksum information is generated for each data block segmented from a particular packet. The running total of the checksum information may be compared to another running total that is computed, for the data blocks, during the reassembly process or at another point in time during which the data blocks are being processed.

In another implementation, checksum information may be generated for a group of data blocks. In another example, I/O unit 215 may generate checksum information for a group of data blocks associated with a particular packet from which the group data blocks were segmented. The checksum information, for the group of packets, may be generated, and stored in a control blocks associated with the group of data blocks, when the checksum information is generated for each data block. The checksum information, for the group of data blocks, may be compared to other checksum information, generated for the group of data blocks, during the reassembly process or at another point in time during which the data blocks are being processed.

I/O unit 215 may generate control blocks corresponding to each data block. For example, I/O unit 215 may generate control blocks (e.g., CB-1, CB-2 and CB-3) as shown in ellipse 765 of FIG. 7. I/O unit 215 may store the data memory information, associated with each data block, in the corresponding control block in a manner similar to that described above with respect to fields 505-515, associated with control block 540, of FIG. 5. Additionally, or alternatively, I/O unit 215 may store data protection information (e.g., checksum information) computed for each data block in the corresponding control block in a manner similar to that described above with respect to field 545 of control block 540.

I/O unit 215 may obtain control memory information. For example, I/O unit 215 may communicate with control memory 325 to obtain control memory information pertaining to each control block. I/O unit 215 may receive control memory information for each control block that may include next control memory address information (e.g., the control block pointer associated with the control memory address of the next control block) and/or EOP information. For example, as indicated by ellipse 770 of FIG. 7, control memory information associated with CB-1 may include the control memory address "CM-0002" that may indicate the storage location of CB-2 and may include an EOP of zero (e.g., indicating that another control block and/or data block follows); control memory information associated with CB-2 may include the control memory address "CM-0004" that may indicate the storage location of CB-3 and may include an EOP of zero (e.g., indicating that another control block and/or data block follows); and control memory information associated with CB-3 may not include a control memory address (e.g., as indicated by "--") and may include an EOP of one (e.g., indicating that no other control block and/or data block follows).

I/O unit 215 may store the control memory information in each control block. For example, I/O unit 215 may store control information in each control block in a manner similar to that described with respect to fields 520 and 525, associated with control block 540, of FIG. 5B. I/O unit 215 may generate control protection information associated with the packet control information stored in each control block. For example, from the packet control information corresponding to each control block, I/O unit 215 may compute control protection information for each control block using a data integrity algorithm (e.g., a Hamming-based algorithm, a checksum algorithm and/or other data integrity algorithms). As indicated by ellipse 775 of FIG. 7, control protection information associated with each control block (e.g., CB-1, CB-2 and CB-3) may include 6-bit ECC information (e.g., 876543 for CB-1, etc.), which may provide SECDED protection (e.g., as described above with respect to field 550, associated with control block 540, of FIG. 5) for packet control information stored in each control block. I/O unit 215 may store the control protection information for each control block in a manner similar to that described above with respect to field 550 of control block 540.

Data blocks may be stored in data memory and control blocks may be stored in control memory (block 630). For example, I/O unit 215 may store the data blocks (e.g., DB-1, DB-2 and/or DB-3) in data memory 320 in accordance with the data memory information stored in the control blocks (CB-1, CB-2 and/or CB-3). Additionally, or alternatively, I/O unit 215 may store the control blocks in control memory 325 in accordance with the control memory information stored in the control blocks and may receive control block pointer information from control memory 325. The control block pointer information may include control memory 325 storage location information corresponding to the first control block (e.g., CB-1), of the group of control blocks, stored in control memory 325. In another implementation, control pointer information may include storage location information for the first control block and/or other control blocks associated with the group of control blocks stored in memory 325.

At some later point (e.g., when information regarding the packet reaches the front of a queue in I/O unit 215), packet forwarding information may be determined and control blocks may be retrieved (block 635). For example, I/O unit 215 may retrieve a forwarding table from a memory (e.g., a memory associated with I/O unit 215) and, from the destination address information obtained from the header, may perform a lookup operation to obtain next hop information. From the next hop information, I/O unit 215 may determine the egress I/O unit 215 via which the data blocks, when reassembled into an outgoing packet, may be transmitted in accordance with next hop information (e.g., the next node 110 on a network link to which the outgoing packet may be transmitted).

Control blocks may be retrieved from control memory 325. For example, I/O unit 215 may send a read request to control memory 325 that may include the control block pointer information. Control memory 325 may receive the control block pointer and may retrieve the first control block. From the first control block (e.g., CB-1), control memory 325 may determine that additional control blocks follow the first control block (e.g., based on an EOP of zero, corresponding to CB-1, as shown in ellipse 770 of FIG. 7) and may obtain the address at which a second control block (e.g., CB-2) is stored (e.g., based on CM-0002 as indicated by ellipse 770). Control memory 325 may retrieve the second control block and may determine that another control block follows the second control block (e.g., based on an EOP of zero, corresponding to CB-2, as shown in ellipse 770) and may obtain the address at which a third control block (e.g., CB-3) is stored (e.g., based on CM-0004 as indicated by ellipse 770). Control memory 325 may retrieve the third control block and may determine that no control blocks follow the third control block (e.g., based on an EOP of one, corresponding to CB-3, as shown in ellipse 770). Control memory 325 may send the control blocks to I/O unit 215.

A data integrity operation, on the control blocks, may be performed (block 640). For example, I/O unit 215 may receive control blocks from control memory 325 and may obtain packet control information from the control blocks. I/O unit 215 may read the control protection information from the control blocks (e.g., the ECC information, as indicated by ellipse 775, of FIG. 7). Using a data integrity algorithm retrieved from memory (e.g., a Hamming-based algorithm and/or other data integrity algorithms), I/O unit 215 may compute control protection information (e.g., ECC information) from the packet control information (e.g., not including the ECC information). I/O unit 215 may compare the computed control protection information with the control protection information obtained from the control blocks and may determine whether the control blocks contain an error.

If a control block error is detected (block 645—YES), then error processing may be performed (block 650). For example, I/O unit 215 may compare the computed control protection information with the control protection information obtained from the control blocks and may determine that the control blocks contain an error when the computed control protection information does not match the control protection information obtained from the control blocks. If I/O unit 215 further determines that the error is contained in the next control memory address information (e.g., as indicated by ellipse 770 of FIG. 7) and/or the data protection information (e.g., as indicated by ellipse 760 of FIG. 7)) of one or more of the control blocks, then I/O unit 215 may perform an error correction operation using the data integrity algorithm discussed above. If I/O unit 215 determines that the error is not contained in the next control memory address information and/or the data protection information of one or more of the control blocks, then I/O unit 215 may drop the packet associated with the control blocks in which an error is contained.

If a control block error is not detected (block 645—NO), then data blocks may be retrieved and a data integrity operation, on the data blocks, may be performed (block 655). For example, I/O unit 215 may compare the computed control protection information with the control protection information obtained from the control blocks and may determine that the computed control protection information matches the control protection information obtained from the control blocks. I/O unit 215 may determine that an error is not contained in one or more control blocks and may send a read request to data memory 320 to retrieve the data blocks associated with the control blocks. The read request may include data memory information (e.g., data block storage location, offset information, count, etc.) obtained from the control blocks. Data memory 320 may receive the request, may retrieve the data blocks, and may forward the data blocks to I/O unit 215.

A data integrity operation may be performed on the data blocks. For example, I/O unit 215 may receive the data blocks and may perform a data integrity operation on the data blocks. I/O unit 215 may use a data integrity algorithm to compute data protection information (e.g., checksum information and/or other forms of data protection information) for each data block. I/O unit 215 may determine whether an error is contained in one or more data blocks by comparing the computed data protection information with the data protection information obtained from the control blocks (e.g., the checksum information, as indicated by ellipse 760, of FIG. 7) corresponding to the data blocks.

In another example, I/O unit 215 may compute a running total of the checksum information, from the checksum information generated for each data block associated with a particular packet. I/O unit 215 may compare the computed running total of the checksum information with the running total of the checksum information read from a control block, associated with a data block, or a group of data blocks, to determine whether an error is contained in the group of data blocks associated with the particular packet.

In yet another example, I/O unit 215 may generate checksum information for a group of data blocks associated with a particular packet. I/O unit 215 may compare the generated checksum, for the group of data blocks, with a checksum, for the group of data blocks, read from a control block associated with the group of data blocks to determine whether an error is contained in the group of data blocks associated with the particular packet.

If a data block error is detected (block 660—YES), then error processing may be performed (block 650). For example, I/O unit 215 may compare the computed data protection information (e.g., checksum information, running total of the checksum information, and/or other data protection information) with the data protection information obtained from the control blocks and may determine that the computed data protection information does not match the data protection information obtained from the control blocks. I/O unit 215 may determine that an error is contained in one or more of the data blocks and may generate an error notification in a manner similar to that discussed above (at block 615). In one example, I/O unit 215 may continue to process the data blocks for transmission to the next node 110. In another example, I/O unit 215 may drop the outgoing packet associated with the data block in which an error is contained. In yet another example, I/O unit 215 may receive another packet from the ingress node 110 to replace the packet associated with the data block containing the error.

If a data block error is not detected (block 660—NO), then data blocks may be forwarded to the egress I/O unit 215 (block 665). For example, I/O unit 215 may compare the computed data protection information (e.g., checksum information, running total of the checksum information, and/or other data protection information) with the data protection information obtained from the control blocks and may determine that the computed data protection information matches the data protection information obtained from the control blocks. I/O unit 215 may determine that an error is not contained in one or more of the data blocks and may forward the data blocks to the egress I/O unit 215 (e.g., determined from the packet forwarding information) via switch fabric 205 and may forward the header to egress I/O unit 215, via a control plane, separate from switch path 205.

In another implementation, I/O unit 215 may append data protection information to each data block and may forward the data blocks, with the appended data protection information, to the egress I/O unit 215 via switch fabric 205. In yet another implementation, I/O unit 215 may perform a reassembly operation on the data blocks to create an outgoing packet. In this example, I/O unit 215 may append the header to the outgoing packet and may forward the outgoing packet, with the header, to egress I/O unit 215 via switch fabric 205.

In still another implementation, I/O unit 215 may determine, from the packet forwarding information, that I/O unit 215 may be both the ingress I/O unit 215, that received the packet, and the egress I/O unit 215, from which the packet is to be outputted. In this example, I/O unit 215 may not forward the data blocks to another egress I/O unit 215 via switch fabric 205. I/O unit 215 may, instead, perform a reassembly operation on the data blocks. For example, I/O unit 215 may assemble the data blocks to create an outgoing packet, may append the header to the outgoing packet, and may transmit the outgoing packet to the next node 110, via a particular I/O port (e.g., I/O port 300), in accordance with the packet forwarding information.

Figure 8:
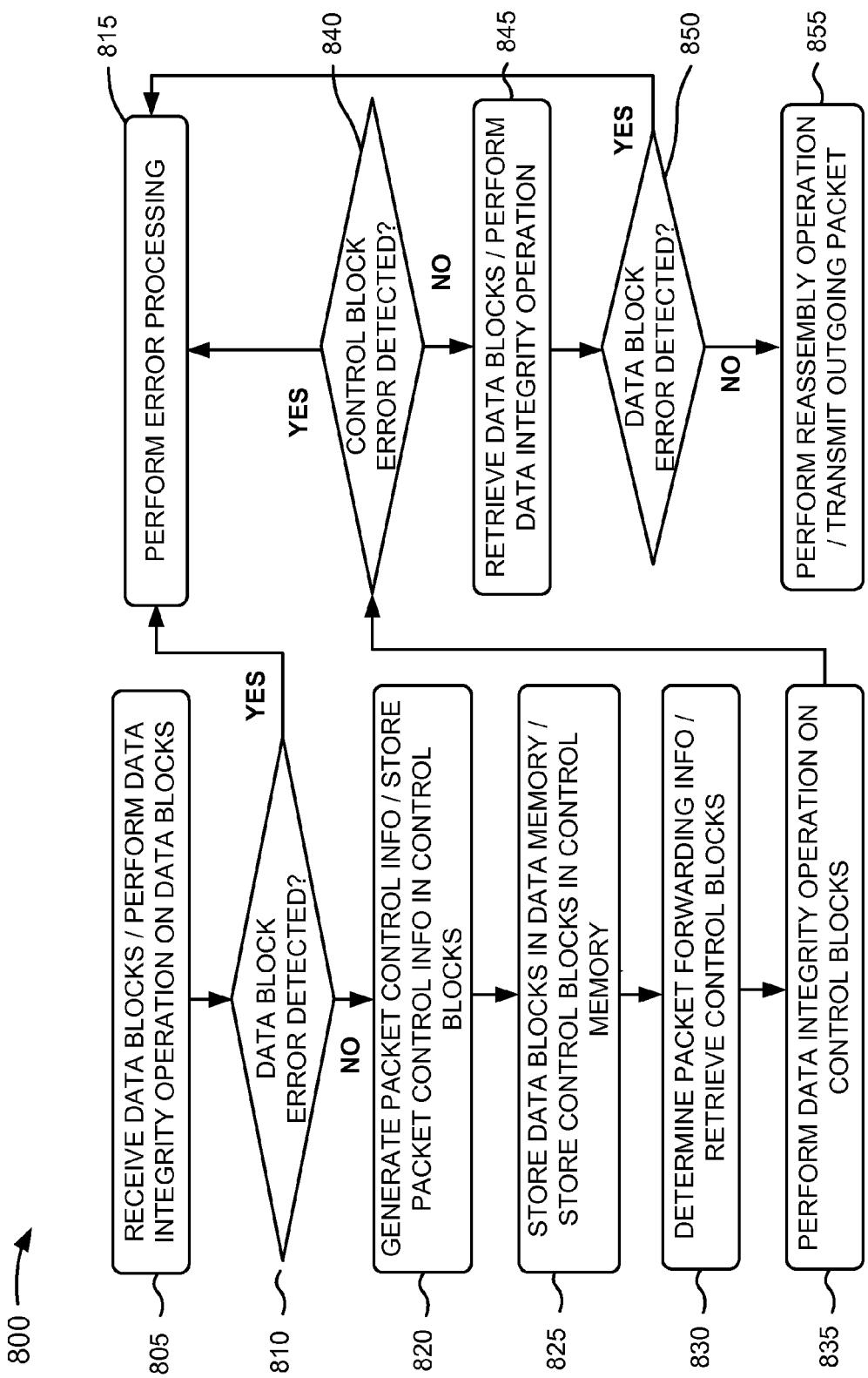
FIG. 8 is a flowchart of an exemplary process for performing an outgoing packet buffering operation that is capable of being performed by the node of FIG. 2.

FIG. 8 is a flowchart of an exemplary process 800 for performing an outgoing packet buffering operation that is capable of being performed by node 110. In one implementation, process 800 may be performed by an I/O unit 215. In another implementation, some or all of process 800 may be performed by a device or collection of devices separate from or in combination with I/O unit 215.

Process 800, of FIG. 8, may include receiving data blocks and performing, on the data blocks, a data integrity operation (block 805). Assume that ingress I/O unit 215 is an I/O unit that receives incoming packets, processes incoming packets to create packet data (e.g., data blocks, control blocks, headers, etc.) and forwards packet data to an egress I/O unit 215. Assume further that egress I/O unit 215 is an I/O unit that receives packet data, processes packet data (e.g., data blocks, control blocks, headers, etc.), assembles packet data into outgoing packets, and transmits outgoing packets to another node 110, via a network link, within network 100. For example, egress I/O unit 215 may receive data blocks from ingress I/O unit 215 via switch fabric 205 and may obtain data protection information for the data blocks. In one example, the data protection information be sent separately from the data blocks (e.g., via a control plane). In another example, the data protection information may be sent with the data blocks (e.g., appended to the data blocks) via switch fabric 205. In a manner similar to that described above (with respect to block 655 of FIG. 6), egress I/O unit 215 may compute data protection information. Egress I/O unit 215 may compare the data protection information for the data blocks with the computed data protection information to determine whether the data blocks contain an error.

If a data block error is detected (block 810—YES) then error processing may be performed (block 815). For example, egress I/O unit 215 may compare the computed data protection information (e.g., checksum information, running total of the checksum information, and/or other data protection information) with the data protection information obtained from the data blocks and may determine that the data blocks contain an error when the computed data protection information does not match the data protection information obtained from the data blocks. In one example, egress I/O unit 215 may continue to process the data blocks for transmission to the next node 110. In another example, egress I/O unit 215 may drop the outgoing packet associated with the data block in which an error is contained.

If a data block error is not detected (block 810—NO), then packet control information may be generated and packet control information may be stored in control blocks (block 820). For example, egress I/O unit 215 may compare the computed data protection information (e.g., checksum information, running total of the checksum information, and/or other data protection information) with the data protection information obtained from the data blocks and may determine that the computed data protection information matches the data protection information obtained from the data blocks. Egress I/O unit 215 may determine that the data blocks do not contain an error and may generate packet control information or each data block.

Packet control information may be generated and packet control information may be stored in control blocks. For example, in a manner similar to that described above (with respect to block 625 of FIG. 6) egress I/O unit 215 may obtain data memory information from data memory 320 associated with the data blocks that may include storage location information, offset, count, and/or allocated memory for each data block (e.g., DB-1, DB-2 and/or DB-3).

Egress I/O unit 215 may generate a separate control block corresponding to each data block. For example, in a manner similar to that described above (with respect to block 625 of FIG. 6), egress I/O unit 215 may generate control blocks corresponding to the data blocks (e.g., CB-1, CB-2 and CB-3). Egress I/O unit 215 may obtain control memory information pertaining to each control block from control memory 325 that may include next control memory 325 address information (e.g., the control block pointer associated with the control memory 325 address of the next control block) and/or EOP information.

Egress I/O unit 215 may store packet control information in the control blocks. For example, egress I/O unit 215 may store, as control protection information, the data memory information (e.g., obtained from data memory 320 associated with each data block), the data protection information (e.g., checksum information computed for each data block) and/or the control memory information (e.g., obtained from control memory 325 for each control block) in the control blocks corresponding to the data blocks.

Egress I/O unit 215 may generate control protection information for each control block. For example, in a manner similar to that described above (with respect to block 625 of FIG. 6), egress I/O unit 215 may obtain the packet control information stored in each control blocks and, using a data integrity algorithm (e.g., a Hamming-based algorithm, a checksum algorithm and/or other data integrity algorithms), may compute control protection information for each control block (e.g., ECC information). Egress I/O unit 215 may store the control protection information in each control block.

Data blocks may be stored in data memory and control blocks may be stored in control memory (block 825). For example, egress I/O unit 215 may store the data blocks (e.g., DB-1, DB-2 and/or DB-3) in data memory 320 in accordance with the data memory information stored in the control blocks (CB-1, CB-2 and/or CB-3). Additionally, or alternatively, egress I/O unit 215 may store the control blocks in control memory 325 in accordance with the control memory information stored in the control blocks and may receive control block pointer information from control memory 325. The control block pointer information may include control memory 325 storage location information corresponding to the first control block (e.g., CB-1), of the group of control blocks, stored in control memory 325. In another implementation, control pointer information may include storage location information for the first control block and/or other control blocks associate with the group of control blocks stored in memory 325.

At some later point (e.g., when information regarding the packet reaches the front of a queue in egress I/O unit 215), packet forwarding information may be determined and control blocks may be retrieved (block 830). For example, egress I/O unit 215 may retrieve forwarding tables from a memory (e.g., a memory associated with egress I/O unit 215) and, from the destination address information obtained from the header (e.g. obtained from the data blocks and/or received via a control plane), may perform a lookup operation to obtain next hop information. From the next hop information, egress I/O unit 215 may determine via which I/O port (e.g., I/O port 300) the data blocks, when reassembled into an outgoing packet, may be transmitted.

Control blocks may be retrieved from control memory 325. For example, in a manner similar to that described above (with respect to block 635 of FIG. 6), egress I/O unit 215 may send a read request to control memory 325 that may include the control block pointer information. Control memory 325 may receive the control block pointer and may retrieve the first control block (e.g., CB-1). From the control memory information obtained from the first block, control memory 325 may determine that another control block, of the group of control blocks, follows (e.g., based on an EOP bit equal to zero) and may retrieve the second control block (e.g., CB-2). From the control memory information obtained from the second control block, control memory 325 may determine that another control block follows (e.g., based on an EOP bit equal to zero) and may retrieve the third control block (e.g., CB-3). From the control memory information obtained from the third control block, control memory 325 may determine that no control blocks follow the third control block (e.g., based on an EOP equal to one). Control memory 325 may send the control blocks to egress I/O unit 215.

A data integrity operation, on the control blocks, may be performed (block 835). For example, in a manner similar to that described above (with respect to block 640 of FIG. 6), egress I/O unit 215 may receive control blocks from control memory 325 and may obtain packet control information from the control blocks. Egress I/O unit 215 may remove the control protection information from the control blocks (e.g., the ECC information and/or other forms of packet protection information). Egress I/O unit 215 may compute control protection information using a data integrity algorithm similar to that described above (with respect to block 640 of FIG. 6). Egress I/O unit 215 may compare the computed control protection information with the control protection information obtained from the control blocks and may determine whether the control blocks contain an error.

If a control block error is detected (block 840—YES), then error processing may be performed (block 815). For example, in a manner similar to that described above (with respect to block 645—YES of FIG. 6), egress I/O unit 215 may determine that the control blocks contain an error when the computed control protection information does not match the control protection information obtained from the control blocks. If egress I/O unit 215 further determines that the error is contained in the next control memory address information (e.g., as indicated by ellipse 770 of FIG. 7) and/or the data protection information (e.g., as indicated by ellipse 760 of FIG. 7)) of one or more of the control blocks, then egress I/O unit 215 may perform an error correction operation using the data integrity algorithm discussed above. If egress I/O unit 215 determines that the error is not contained in the next control memory address information and/or the data protection information of one or more of the control blocks, then egress I/O unit 215 may drop the packet associated with the control blocks in which an error is contained.

If a control block error is not detected (block 840—NO), then data blocks may be retrieved and a data integrity operation, on the data blocks, may be performed (block 845). For example, in a manner similar to that described above (with respect to block 645—NO of FIG. 6), egress I/O unit 215 may determine that an error is not contained in one or more control blocks and may send a read request to data memory 320 to retrieve the data blocks associated with the control blocks. The read request may include data memory information (e.g., data block storage location, offset information, count, etc.) obtained from the control blocks. Data memory 320 may receive the request, may retrieve the data blocks, and may forward the data blocks to egress I/O unit 215.

A data integrity operation may be performed on the data blocks. For example, in a manner similar to that described above (with respect to block 655 of FIG. 6), egress I/O unit 215 may receive data blocks and may perform a data integrity operation on the data blocks. Egress I/O unit 215 may use a data integrity algorithm to compute data protection information (e.g., checksum information, a running total of the checksum information, and/or another form of data protection information) for each data block. Egress I/O unit 215 may determine whether an error is contained in one or more data blocks by comparing the computed data protection information with the data protection information obtained from the control blocks corresponding to the data blocks.

If a data block error is detected (block 850—YES), then error processing may be performed (block 815). For example, in a manner similar to that described above (with respect to block 660—YES of FIG. 6), egress I/O unit 215 may determine that the computed data protection information does not match the data protection information obtained from the control blocks. Egress I/O unit 215 may determine that an error is contained in one or more of the data blocks and may generate an error notification in a manner similar to that discussed above (at block 815).

If a data block error is not detected (block 850—NO), then a reassembly operation may be performed and an outgoing packet may be transmitted (block 855). For example, egress I/O unit 215 may compare the computed data protection information (e.g., checksum information, a running total of the checksum information, and/or other data protection information) with the data protection information obtained from the control blocks and may determine that the computed data protection information matches the data protection information obtained from the control blocks. Egress I/O unit 215 may determine that an error is not contained in one or more of the data blocks and may reassemble the data blocks into an outgoing packet (e.g., packet data field 410 of FIG. 4). Egress I/O unit 215 may append the header to the outgoing packet and may transmit the outgoing packet to the next node 110, via a particular I/O port (e.g., I/O port 300), in accordance with the packet forwarding information.

While a particular number and order of blocks have been described with respect to process 800, in another implement, one or more of blocks 820-850, of process 800, may not be performed. For example, egress I/O unit 215 may receive data blocks from ingress I/O unit 215 via switch fabric 205, may perform a data integrity operation on the data blocks (e.g., in a manner similar to that described above (e.g., with respect to 805-815), and may reassemble the data blocks into an outgoing packet in a manner similar to that described above (with respect to block 855).

CONCLUSION

Implementations described herein may include systems and/or methods that provide for optimization of data memory utilization using a technique that can store data integrity information in the control memory instead of the data memory. Storing data integrity information in control memory may free up data memory so that packet buffering capacity may be increased without incurring the cost and/or the space associated with incorporating additional memory devices and/or higher capacity devices into nodes within a network.

In an exemplary implementation, an I/O unit, associated with a node, may receive an incoming packet, may remove the header from the incoming packet, and may perform a segmentation operation by dividing the packet data into fixed-length data blocks. The I/O unit may generate data protection information for each data block. The I/O unit may generate control blocks corresponding to the data blocks and may store packet control information, in the control blocks, which may include data protection information, data memory information associated with data block storage, and control memory information associated with control block storage. The I/O unit may compute control protection information from the packet control information and may store the control protection information in the control blocks. The I/O unit may store the data blocks in the data memory and may store the control blocks in the control memory. The I/O unit may perform a lookup operation from a forwarding table to determine the egress I/O unit via which an outgoing packet may be transmitted. I/O unit may retrieve control blocks from control memory and may perform a data integrity operation on the control blocks. I/O unit may retrieve the data blocks from memory and may perform a data integrity operation on the data blocks and may forward the data blocks to the egress I/O unit (which may be the same or a different I/O unit).

In another implementation, an egress I/O unit may receive data blocks from another I/O unit via the switch fabric and may perform a data integrity operation by computing data protection information from the data blocks and comparing the computed data protection information with the data protection information obtained from the header, that was obtained from the data blocks, to determine whether the data blocks contain an error. The egress I/O unit may generate control blocks corresponding to the data blocks and may store packet control information in the control blocks, which may include data protection information, data memory information associated with data block storage, and control memory information associated with control block storage. The egress I/O unit may compute control protection information from the packet control information and may store the control protection information in the control blocks. The egress I/O unit may store the data blocks in the data memory and may store the control blocks in the control memory. The egress I/O unit may perform a lookup operation from a forwarding table to determine via which egress I/O port the outgoing packet may be transmitted. Egress I/O unit may retrieve the control blocks from the control memory and may perform a data integrity operation on the control blocks. Egress I/O unit may retrieve the data blocks from the data memory and may perform a data integrity operation on the data blocks. Egress I/O unit may reassemble the data blocks into an outgoing packet, may append the header to the outgoing packet, and may forward the outgoing packet to the next node via the egress I/O port.

The foregoing description provides illustration and description, but is not intended to be exhaustive or to limit the invention to the precise form disclosed. Modifications and variations are possible in light of the above teachings or may be acquired from practice of the invention.

While an ingress I/O unit and an egress I/O unit are described as performing different acts and/or operations, it should be understood that, in other implementations, an egress I/O unit may perform one or more of the same or similar acts and/or functions as the ingress I/O unit and the ingress I/O unit may perform one or more of the same or similar functions as the egress I/O unit.

While series of blocks have been described with regard to FIGS. 6 and 8, the order of the blocks may be modified in other embodiments. Further, non-dependent blocks may be performed in parallel. For example, blocks of FIGS. 6 and 8 may be performed in a pipelined manner with multiple instances of the pipeline operating at any given point in time. In other words, I/O units associated with a node may be performing a particular operation on a packet or a set of packets while performing another operation on another packet or another set of packets.

It will be apparent that embodiments, as described herein, may be implemented in many different forms of software, firmware, and hardware in the embodiments illustrated in the figures. The actual software code or specialized control hardware used to implement embodiments described herein is not limiting of the invention. Thus, the operation and behavior of the embodiments were described without reference to the specific software code—it being understood that software and control hardware may be designed to implement the embodiments based on the description herein.

Further, certain portions, described above, may be implemented as a component that performs one or more functions. A component, as used herein, may include hardware, such as a processor, an ASIC, or a FPGA, or a combination of hardware and software (e.g., a processor executing software).

It should be emphasized that the term "comprises/comprising" when used in this specification is taken to specify the presence of stated features, integers, steps or components but does not preclude the presence or addition of one or more other features, integers, steps, components or groups thereof.

Even though particular combinations of features are recited in the claims and/or disclosed in the specification, these combinations are not intended to limit the disclosure of the invention. In fact, many of these features may be combined in ways not specifically recited in the claims and/or disclosed in the specification.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:
1. A method comprising:
receiving, by an input/output (I/O) unit of a network device, a packet;
segmenting, by the I/O unit, the packet into a plurality of data blocks;
storing, by the I/O unit, the plurality of data blocks in a data memory of the I/O unit;
generating, by the I/O unit, data protection information for a particular data block of the plurality of data blocks;
creating, by the I/O unit, a plurality of control blocks for the plurality of data blocks,
the plurality of control blocks corresponding to the plurality of data blocks, and a particular control block, of the plurality of control blocks, corresponding to the particular data block;

storing, in a control memory of the I/O unit, a plurality of data items for the particular control block, the plurality of data items including:

information associated with a location of the particular data block within the data memory, information associated with a location, of another control block of the plurality of control blocks, within the control memory, and the data protection information for the particular data block;

receiving, by the I/O unit, the particular control block from the control memory;

obtaining, by the I/O unit, packet control information from the particular control block;

performing, by the I/O unit, a first data integrity check on the particular control block based on the packet control information;

performing, by the I/O unit, a second data integrity check on the particular data block, by using the data protection information for the particular control block, when the first data integrity check indicates that the particular control block does not contain an error; and outputting, by the I/O unit, the particular data block when the second data integrity check indicates that the particular data block does not contain a data error.

2. The method of claim 1, where generating the data protection information for the particular data block includes:

using a particular algorithm to compute the data protection information, and storing, in the control memory, the data protection information in the particular control block.

3. The method of claim 1, where performing the second data integrity check on the particular data block includes:

computing, by using a data integrity algorithm, other data protection information for the particular data block;

determining whether the data protection information matches the other data protection information; and determining that the particular data block does not contain the data error when the data protection information matches the other data protection information.

4. The method of claim 1, where performing the second data integrity check on the particular data block further includes:

computing, by using a data integrity algorithm, other data protection information for the particular data block;

determining that the particular data block contains the data error when the data protection information does not match the other data protection information corresponding to the particular data block; and dropping the packet after determining that the particular data block contains the error.

5. The method of claim 1, where the packet includes header information, the header information including destination address information; and where outputting the particular data block when the data integrity check indicates that the particular data block does not contain the data error includes:

retrieving forwarding table information, the forwarding table information including next hop information;

performing a look up operation to obtain the next hop information, from the forwarding table information, the next hop information corresponding to the destination address information;

reassembling the plurality of data blocks to create an outgoing packet; and outputting the outgoing packet, over a network link, based on the next hop information.

6. The method of claim 1, where storing the plurality of data items for the particular control block includes:

computing, based on the plurality of data items, control protection information, corresponding to the particular control block, using a data integrity algorithm;

generating the packet control information based on the control protection information; and storing the packet control information in the particular control block.

7. The method of claim 1, where the packet control information includes control protection information corresponding to the particular control block; and where storing the plurality of data items for the particular control block includes:

computing, based on the plurality of data items, other control protection information by using a data integrity algorithm;

determining whether the control protection information matches the other control protection information corresponding to the particular control block; and storing the data protection information when the control protection information matches the other control protection information.

8. The method of claim 1, further comprising:

retrieving, from the data memory, the particular data block by using the information associated with the location of the particular data block;

retrieving, from the control memory, the other control block based on the information associated with the location of the other control block, the other control block including other information associated with another location of another data block of the plurality of data blocks, retrieving, from the data memory, the other data block based on the other information, associated with the other location of the other data block;

reassembling the particular data block and the other data block to create an outgoing packet; and transmitting the outgoing packet on a network link.

9. A network device comprising:

a data memory to store a plurality of data blocks;

a control memory to store a plurality of control blocks; and one or more I/O units to:

receive a packet from another network device of a plurality of network devices, perform a segmentation operation on the packet to create the plurality of data blocks, store the plurality of data blocks in the data memory, create a plurality of control blocks for the plurality of data blocks, the plurality of control blocks corresponding to the plurality of data blocks, a particular control block, of the plurality of control blocks, corresponding to a particular data block of the plurality of data blocks, store, in the control memory, the plurality of control blocks, the particular control block including a plurality of data items, the plurality of data items including:

data protection information for the particular data block, and information identifying a location of the particular data block in the data memory,
receive the particular control block from the control memory,
obtain packet control information from the particular control block,
perform a first data integrity check on the particular control block based on the packet control information,
perform a second data integrity check on the particular data block, by using the data protection information for the particular control block, when the first data integrity check indicates that the particular control block does not contain an error, and
output the particular data block when the second data integrity check indicates that the particular data block does not contain a data error.

10. The network device of claim 9,
where the packet includes header information,
the header information including packet protection information; and
where the one or more I/O units are further to:
read the packet header information from the packet,
compute, for the packet, other packet protection information by using a first data integrity algorithm,
determine whether the packet protection information matches the other packet protection information,
determine that the packet does not contain the data error when the packet protection information matches the other packet protection information,
divide the packet into the plurality of data blocks when the packet does not contain the data error, and
compute, for the plurality of data blocks, the data protection information by using a second data integrity algorithm.

11. The network device of claim 9, where, when performing the second data integrity check on the particular data block by using the data protection information from the particular control block, the one or more I/O units are to:
compute, using a data integrity algorithm, other data protection information for the particular data block,
determine whether the data protection information matches the other data protection information, and
determine that the particular data block does not contain the data error when the data protection information matches the other data protection information.

12. The network device of claim 9,
where the packet includes header information,
the header information including next hop information; and
where, when outputting the particular data block, the one or more I/O units are to:
retrieve forwarding table information,
the forwarding table information including information regarding a plurality of I/O ports associated with the one or more I/O units, and
a particular I/O port, of the plurality of I/O ports, corresponding to the next hop information,
perform a look up operation to identify the particular I/O port via which to transmit an outgoing packet,
assemble the plurality of data blocks to create the outgoing packet, and
transmit the outgoing packet via the particular I/O port.

13. The network device of claim 9,
where, when storing the plurality of control blocks, the one or more I/O units are to:
compute control protection information for the particular control block, by using a data integrity algorithm, based on the plurality of data items,
generate the packet control information based on the control protection information; and
store the packet control information in the control memory.

14. The network device of claim 13, where, when performing the first data integrity check, the one or more I/O units are to:
compute other control protection information for the particular control block, based on the packet control information,
determine that the particular control block contains the error when the control protection information does not match the other control protection information, and
drop the packet when the particular control block contains the error.

15. The network device of claim 9, where the one or more I/O units are further to:
read, from the particular control block, the information identifying the location of the particular data block in the data memory, and
retrieve, from the data memory, the particular data block based on the information identifying the location of the particular data block in the data memory.

16. A system comprising:
a network device to:
receive a packet,
segment the packet into a plurality of data blocks,
store the plurality of data blocks in a data memory,
create a plurality of control blocks for the plurality of data blocks,
a particular control block, of the plurality of control blocks, corresponding to one or more particular data blocks of the plurality of data blocks,
store, in the control memory, the particular control block,
the particular control block including control information,
the control information for the particular control block including data protection information for the one or more particular data blocks, and
information associated with a location of the one or more particular data blocks in the data memory,
receive the particular control block from the control memory,
obtain control information from the particular control block,
determine control protection information based on the control information,
perform a first data integrity check on the particular control block by using the control protection information,
retrieve the one or more particular data blocks, from the data memory, based on the information associated with the location of the one or more particular data blocks, when the first data integrity check indicates that the particular control block does not contain an error,
perform a second data integrity check on the one or more particular data blocks by using the data protection information, and
output the one or more particular data blocks when the second data integrity check indicates that the one or more particular data blocks do not contain a data error.

17. The system of claim 16,
where the packet includes packet protection information; and
where, when segmenting the packet into the plurality of data blocks, the network device is further to:
read the packet protection information from the packet,
compute, for the packet, other packet protection information by using a first data integrity algorithm,
compare the packet protection information with the other packet protection information to determine whether the data error is contained in the packet, and
segment the packet into the plurality of data blocks when the packet does not contain the data error.

18. The system of claim 16, where, when determining the control protection information, the network device is to:
compute the control protection information, based on the control information, by using a data integrity algorithm, and
store the control protection information in the control memory.

19. The system of claim 16,
where the control information for the particular control block includes the control protection information; and
where, when performing the first data integrity check on the particular control block, the network device is to:
compute other control protection information, for the particular control block, based on the control information,
compare the control protection information with the other control protection information, and
determine, based on the comparing, that the particular control block does not contain the error when the control protection information matches the other control protection information.

20. The system of claim 16, where, when performing the first data integrity check on the particular control block, the network device is to:
determine other control protection information for the particular control block,
determine that the particular control block contains the error when the control protection information does not match the other control protection information, and
perform an error correction operation on the particular control block after determining that the particular control block contains the error.

21. The system of claim 16, where, when performing the second data integrity check on the one or more particular data blocks, the network device is further to:
compute other data protection information, for the one or more particular data blocks, by using a data integrity algorithm,
compare the data protection information with the other data protection information, and
determine, based on the comparing, that the one or more particular data blocks do not contain the data error when the data protection information, matches the other data protection information.

22. The system of claim 16, where, when performing the second data integrity check on the one or more particular data blocks, the network device is further to:
determine other data protection information for the one or more particular data blocks;
determine that the one or more particular data blocks contain the data error when the data protection information does not match the other data protection information, and
drop the packet, when the one or more particular data blocks contain the data error.

23. The system of claim 16,
where the one or more particular data blocks include two or more data blocks, and
where, when performing the second data integrity check on the one or more particular data blocks, the network device is to:
generate checksums for the two or more data blocks,
compute a running total checksum, for the two or more data blocks based on a sum of the checksums,
obtain another running total checksum from the particular control block,
compare the running total checksum with the other running total checksum, and
determine, based on the comparing, that the two more data blocks do not contain the data error when the running total checksum matches the other running total checksum.

* * * * *